United States Patent
Hubert et al.

(10) Patent No.: US 11,582,388 B2
(45) Date of Patent: Feb. 14, 2023

(54) OPTICAL IMAGE STABILIZATION WITH VOICE COIL MOTOR FOR MOVING IMAGE SENSOR

(71) Applicant: Apple Inc., Cupertino, CA (US)

(72) Inventors: Aurelien R. Hubert, Saratoga, CA (US); Qiang Yang, Fremont, CA (US); Douglas S. Brodie, Los Gatos, CA (US); Scott W. Miller, Los Gatos, CA (US); Shashank Sharma, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 88 days.

(21) Appl. No.: 17/175,469

(22) Filed: Feb. 12, 2021

(65) Prior Publication Data

US 2021/0168289 A1    Jun. 3, 2021

Related U.S. Application Data

(63) Continuation of application No. 16/083,819, filed as application No. PCT/US2017/021915 on Mar. 10, 2017, now Pat. No. 10,924,675.

(Continued)

(51) Int. Cl.
*H04N 5/232* (2006.01)
*G03B 5/00* (2021.01)
(Continued)

(52) U.S. Cl.
CPC ........... *H04N 5/23287* (2013.01); *G02B 7/08* (2013.01); *G02B 27/646* (2013.01); *G03B 5/00* (2013.01);
(Continued)

(58) Field of Classification Search
CPC ........ G02B 27/646; G02B 7/08; G03B 13/36; G03B 2205/0007; G03B 2205/0069;
(Continued)

(56) References Cited

U.S. PATENT DOCUMENTS

| 7,170,690 B2 | 1/2007 | Ophey |
| 7,612,953 B2 | 11/2009 | Nagai et al. |

(Continued)

FOREIGN PATENT DOCUMENTS

| CN | 1940628 | 4/2007 |
| CN | 101808191 | 8/2010 |

(Continued)

OTHER PUBLICATIONS

Notice of Eligibility for Grant and Examination Report from Singapore Application No. 11201807830U dated Mar. 1, 2021, pp. 1-5.

(Continued)

*Primary Examiner* — Amy R Hsu
(74) *Attorney, Agent, or Firm* — Robert C. Kowert; Kowert, Hood, Munyon, Rankin & Goetzel, P.C.

(57) ABSTRACT

In some embodiments, a camera actuator includes an actuator base, an autofocus voice coil motor, and an optical image stabilization voice coil motor. In some embodiments, the autofocus voice coil motor includes a lens carrier mounting attachment moveably mounted to the actuator base, a plurality of shared magnets mounted to the base, and an autofocus coil fixedly mounted to the lens carrier mounting attachment for producing forces for moving a lens carrier in a direction of an optical axis of one or more lenses of the lens carrier. In some embodiments, the optical image stabilization voice coil motor includes an image sensor carrier moveably mounted to the actuator base, and optical image stabilization coils moveably mounted to the image sensor (Continued)

carrier within the magnetic fields of the shared magnets, for producing forces for moving the image sensor carrier in a plurality of directions orthogonal to the optical axis.

20 Claims, 24 Drawing Sheets

Related U.S. Application Data

(60) Provisional application No. 62/399,095, filed on Sep. 23, 2016, provisional application No. 62/307,416, filed on Mar. 11, 2016.

(51) Int. Cl.
| | | |
|---|---|---|
| *G02B 27/64* | (2006.01) | |
| *G02B 7/08* | (2021.01) | |
| *G03B 13/36* | (2021.01) | |
| *H02K 41/035* | (2006.01) | |

(52) U.S. Cl.
CPC ......... *G03B 13/36* (2013.01); *H02K 41/0356* (2013.01); *G03B 2205/0007* (2013.01); *G03B 2205/0069* (2013.01); *H02K 2201/18* (2013.01); *H04N 5/23293* (2013.01)

(58) Field of Classification Search
CPC .. G03B 5/00; H02K 2201/18; H02K 41/0356; H04N 5/23287; H04N 5/23293; H05K 1/118; H05K 1/165; H05K 1/189; H05K 2201/10121; H05K 2201/10151
See application file for complete search history.

(56) References Cited

U.S. PATENT DOCUMENTS

| | | |
|---|---|---|
| 7,630,618 B2 | 12/2009 | Nomura |
| 7,952,612 B2 | 5/2011 | Kakkori |
| RE42,642 E | 8/2011 | Sato et al. |
| 8,111,295 B2 | 2/2012 | Makimoto et al. |
| 8,248,497 B2 | 8/2012 | Tanimura et al. |
| 8,264,549 B2 | 9/2012 | Tokiwa et al. |
| 8,488,260 B2 | 7/2013 | Calvet et al. |
| 8,548,313 B2 | 10/2013 | Krueger |
| 8,749,643 B2 | 6/2014 | Lim et al. |
| 8,817,393 B2 | 8/2014 | Kwon |
| 8,866,918 B2 | 10/2014 | Gregory et al. |
| 8,908,086 B2 | 12/2014 | Kawai |
| 8,947,544 B2 | 2/2015 | Kawai |
| 8,998,514 B2 | 4/2015 | Gutierrez et al. |
| 9,298,017 B2 | 3/2016 | Sugawara et al. |
| 9,316,810 B2 | 4/2016 | Mercado |
| 9,578,217 B2 | 2/2017 | Gutierrez et al. |
| 9,632,280 B2 | 4/2017 | Yeo |
| 9,736,345 B1 | 8/2017 | Topliss et al. |
| 9,773,169 B1 | 9/2017 | Fulmer |
| 9,807,305 B2 * | 10/2017 | Gutierrez ................. G03B 3/10 |
| 10,257,433 B2 | 4/2019 | Eromaki |
| 10,863,094 B2 | 12/2020 | Sharma et al. |
| 10,890,734 B1 | 1/2021 | Sharma et al. |
| 10,924,675 B2 | 2/2021 | Hubert et al. |
| 11,122,205 B1 | 9/2021 | Sharma et al. |
| 11,163,141 B2 | 11/2021 | Yao et al. |
| 11,223,766 B2 | 1/2022 | Sharma et al. |
| 2001/0001588 A1 | 5/2001 | Matz |
| 2003/0160902 A1 | 8/2003 | Mihara et al. |
| 2003/0184878 A1 | 10/2003 | Tsuzuki |
| 2004/0105025 A1 | 6/2004 | Scherling |
| 2004/0257677 A1 | 12/2004 | Matsusaka |
| 2006/0017815 A1 | 1/2006 | Stavely et al. |
| 2007/0024739 A1 | 2/2007 | Konno |
| 2007/0070525 A1 | 3/2007 | Taniyama |
| 2007/0279497 A1 | 12/2007 | Wada et al. |
| 2009/0147340 A1 | 6/2009 | Lipton et al. |
| 2009/0179995 A1 | 7/2009 | Fukumoto et al. |
| 2009/0295986 A1 | 12/2009 | Topliss et al. |
| 2009/0296238 A1 | 12/2009 | Kakuta |
| 2010/0165131 A1 | 7/2010 | Makimoto et al. |
| 2010/0315521 A1 | 12/2010 | Kunishige et al. |
| 2011/0141294 A1 | 6/2011 | Lam |
| 2011/0141339 A1 | 6/2011 | Seo |
| 2011/0235194 A1 * | 9/2011 | Nobe ................... G02B 13/001 359/823 |
| 2012/0106936 A1 | 5/2012 | Lim et al. |
| 2012/0120512 A1 | 5/2012 | Wade et al. |
| 2012/0224075 A1 | 9/2012 | Lim |
| 2012/0268642 A1 | 10/2012 | Kawai |
| 2013/0107068 A1 | 5/2013 | Kim et al. |
| 2013/0119785 A1 | 5/2013 | Han |
| 2013/0250169 A1 | 9/2013 | Kim |
| 2014/0111650 A1 | 4/2014 | Georgiev et al. |
| 2014/0139695 A1 * | 5/2014 | Kawai ...................... G03B 5/00 348/208.99 |
| 2014/0255016 A1 | 9/2014 | Kim et al. |
| 2014/0327965 A1 * | 11/2014 | Chen ................... G02B 27/646 359/557 |
| 2015/0042870 A1 | 2/2015 | Chan et al. |
| 2015/0051097 A1 | 2/2015 | Anderton et al. |
| 2015/0135703 A1 | 5/2015 | Eddington et al. |
| 2015/0195439 A1 | 7/2015 | Miller et al. |
| 2015/0253543 A1 | 9/2015 | Mercado |
| 2015/0253647 A1 | 9/2015 | Mercado |
| 2015/0316748 A1 | 11/2015 | Cheo et al. |
| 2015/0350499 A1 | 12/2015 | Topliss |
| 2015/0358528 A1 | 12/2015 | Brodie et al. |
| 2016/0041363 A1 | 2/2016 | Hagiwara |
| 2016/0070115 A1 | 3/2016 | Miller et al. |
| 2016/0072998 A1 | 3/2016 | Yazawa |
| 2016/0073028 A1 | 3/2016 | Gleason et al. |
| 2016/0154204 A1 | 6/2016 | Lim et al. |
| 2016/0161828 A1 * | 6/2016 | Lee .......................... G03B 3/10 359/824 |
| 2016/0097937 A1 | 7/2016 | Lam |
| 2016/0209672 A1 | 7/2016 | Park et al. |
| 2016/0327773 A1 | 11/2016 | Choi et al. |
| 2016/0360111 A1 | 12/2016 | Thivent et al. |
| 2017/0023781 A1 | 1/2017 | Wang et al. |
| 2017/0054883 A1 | 2/2017 | Sharma et al. |
| 2017/0082829 A1 | 3/2017 | Kudo et al. |
| 2017/0108670 A1 | 4/2017 | Ko |
| 2017/0155816 A1 | 6/2017 | Ito et al. |
| 2017/0285362 A1 | 10/2017 | Hu et al. |
| 2017/0324906 A1 | 11/2017 | Kang et al. |
| 2017/0351158 A1 | 12/2017 | Kudo |
| 2018/0041668 A1 | 2/2018 | Cui |
| 2018/0048793 A1 | 2/2018 | Gross et al. |
| 2018/0171991 A1 | 6/2018 | Miller et al. |
| 2018/0173080 A1 | 6/2018 | Enta |
| 2019/0014258 A1 | 1/2019 | Horesh |
| 2019/0020822 A1 | 1/2019 | Sharma et al. |
| 2021/0132327 A1 | 5/2021 | Sharma et al. |
| 2021/0223563 A1 | 7/2021 | Miller |
| 2021/0409604 A1 | 12/2021 | Sharma et al. |
| 2022/0050277 A1 | 2/2022 | Yuhong et al. |
| 2022/0094853 A1 | 3/2022 | Xu et al. |
| 2022/0124249 A1 | 4/2022 | Sharma et al. |

FOREIGN PATENT DOCUMENTS

| | | |
|---|---|---|
| CN | 102135656 | 7/2011 |
| CN | 102749697 | 10/2012 |
| CN | 103117637 | 5/2013 |
| CN | 104767915 | 7/2015 |
| CN | 104898352 | 9/2015 |
| CN | 10502204 | 11/2015 |
| CN | 105025657 | 11/2015 |
| CN | 204903924 U | 12/2015 |
| CN | 105573014 | 5/2016 |
| CN | 105652557 | 6/2016 |
| CN | 105807537 | 7/2016 |
| CN | 106291862 | 1/2017 |
| CN | 106470303 | 3/2017 |

(56) References Cited

FOREIGN PATENT DOCUMENTS

| | | |
|---|---|---|
| JP | H10285475 A | 10/1998 |
| JP | 2006078854 | 3/2006 |
| JP | 2008203402 A | 9/2008 |
| JP | 2011154403 | 8/2011 |
| JP | 2011203476 | 10/2011 |
| JP | 2013072967 A | 4/2013 |
| JP | 2013125080 A | 6/2013 |
| JP | 2015146040 | 8/2015 |
| JP | 2016028299 | 2/2016 |
| KR | 20100048361 | 5/2010 |
| KR | 20150051097 | 5/2015 |
| KR | 20160000759 | 1/2016 |
| TW | 201114249 | 4/2011 |
| TW | 201418863 | 5/2014 |
| TW | I438543 B | 5/2014 |
| WO | 2016011801 | 1/2016 |
| WO | 2020069391 | 4/2020 |

OTHER PUBLICATIONS

Search Report and Written Opinion from Singapore Application No. 11201807830I1 dated Feb. 21, 2020, pp. 1-10.

Official Action from Chinese Application No. 201780016528.X dated Apr. 7, 2021, (English translation and Chinese version), pp. 1-20.

U.S. Appl. No. 17/719,287, filed Apr. 12, 2022, Seyed Mohammad Javid Mahmoudzadeh.

International Search Report and Written Opinion from PCT/US2017/021915, dated Mar. 10, 2017, Skattward Research LLC, pp. 1-17.

Office Action from Japanese Application No. 2018-548102, (English Translation and Japanese version), dated Aug. 30, 2019, pp. 1-8.

Extended European Search Report and Written Opinion from Application No. 20171319.5-1020, dated Oct. 8, 2020, pp. 1-9.

Office Action from Chinese Application No. 201780016528.X, dated May 27, 2020, (English translation and Chinese version), pp. 1-26.

U.S. Appl. No. 15/940,661, filed Mar. 29, 2018, Shashank Sharma.

U.S. Appl. No. 16/036,838, filed Jul. 16, 2018, Shashank Sharma.

U.S. Appl. No. 16/563,745, filed Sep. 6, 2019, Shashank Sharma.

Office Action dated Aug. 4, 2021 in Japanese Patent Application No. 2020-092323, Apple Inc., pp. 1-4 (including translation).

Japanese Office Action from application No. 2020-092323, dated Oct. 13, 2022, pp. 1-4, Apple Inc.

U.S. Appl. No. 17/542,252, filed Dec. 3, 2021, Yuhong Yao.

\* cited by examiner

OPTICAL IMAGE STABILIZATION WITH VOICE COIL MOTOR FOR MOVING IMAGE SENSOR

This application is a continuation of U.S. patent application Ser. No. 16/083,819, filed Sep. 10, 2018, which is a 371 of PCT Application No. PCT/US2017/021915, filed on Mar. 10, 2017, which claims benefit of priority to U.S. Provisional Patent Application Ser. No. 62/307,416, filed on Mar. 11, 2016, and U.S. Provisional Application Ser. No. 62/399,095, filed on Sep. 23, 2016, which are hereby incorporated by reference in their entirety.

BACKGROUND

Technical Field

This disclosure relates generally to position control and more specifically to position management with optical image stabilization in autofocus camera components.

Description of the Related Art

The advent of small, mobile multipurpose devices such as smartphones and tablet or pad devices has resulted in a need for high-resolution, small form factor cameras for integration in the devices. Some small form factor cameras may incorporate optical image stabilization (OIS) mechanisms that may sense and react to external excitation/disturbance by adjusting location of the optical lens on the X and/or Y axis in an attempt to compensate for unwanted motion of the lens. Some small form factor cameras may incorporate an autofocus (AF) mechanism whereby the object focal distance can be adjusted to focus an object plane in front of the camera at an image plane to be captured by the image sensor. In some such autofocus mechanisms, the optical lens is moved as a single rigid body along the optical axis (referred to as the Z axis) of the camera to refocus the camera.

In addition, high image quality is easier to achieve in small form factor cameras if lens motion along the optical axis is accompanied by minimal parasitic motion in the other degrees of freedom, for example on the X and Y axes orthogonal to the optical (Z) axis of the camera. Thus, some small form factor cameras that include autofocus mechanisms may also incorporate optical image stabilization (OIS) mechanisms that may sense and react to external excitation/ disturbance by adjusting location of the optical lens on the X and/or Y axis in an attempt to compensate for unwanted motion of the lens.

SUMMARY OF EMBODIMENTS

In some embodiments, a camera actuator includes an actuator base, an autofocus voice coil motor, and an optical image stabilization voice coil motor. In some embodiments, the autofocus voice coil motor includes a lens carrier mounting attachment moveably mounted to the actuator base, a plurality of shared magnets mounted to the base, and an autofocus coil fixedly mounted to the lens carrier mounting attachment for producing forces for moving a lens carrier in a direction of an optical axis of one or more lenses of the lens carrier. In some embodiments, the optical image stabilization voice coil motor includes an image sensor carrier moveably mounted to the actuator base, and a plurality of optical image stabilization coils moveably mounted to the image sensor carrier within the magnetic fields of the shared magnets, for producing forces for moving the image sensor carrier in a plurality of directions orthogonal to the optical axis.

Some embodiments may include a flexure module that may be used in an optical image stabilization VCM actuator (e.g., an optical image stabilization actuator) of a camera. The flexure module may include a dynamic platform and a static platform. In various examples, the flexure module may include one or more flexures. The flexures may be configured to mechanically connect the dynamic platform to the static platform. Furthermore, the flexures may be configured to provide stiffness (e.g., in-plane flexure stiffness) to the VCM actuator while allowing the dynamic platform to move along a plane that is orthogonal to an optical axis defined by one or more lenses of the camera. In various embodiments, the flexure module may include one or more flexure stabilizer members. The flexure stabilizer members may be configured to mechanically connect flexures to each other such that the flexure stabilizer members prevent interference between the flexures that are connected by the flexure stabilizer members. In some examples, the flexure module may include electrical traces configured to convey signals from the dynamic platform to the static platform. The electrical traces may be routed from the dynamic platform to the static platform via flexures, flexure stabilizer members, and/or flex circuits.

BRIEF DESCRIPTION OF THE DRAWINGS

FIG. 3 shows an exploded view of the camera. FIG. 4 shows a cross-sectional view of the camera. FIG. 5 shows a perspective view of the exterior of the camera.

FIG. 8A illustrates a top view of the example flexure module. FIG. 8B illustrates a perspective view of the example flexure module.

In FIGS. 11A-11B, the example flexure module may include electrical traces routed from a dynamic frame to a static frame via flexures.

FIG. 11A illustrates a top view of the example flexure module. FIG. 11B illustrates a perspective view of the example flexure module.

In FIGS. 12A-12B, the example flexure module may include one or more flex circuits configured to route electrical traces from a dynamic frame to a static frame. FIG. 12A illustrates a top view of the example flexure module. FIG. 12B illustrates a perspective view of the flexure module.

Figure 1:
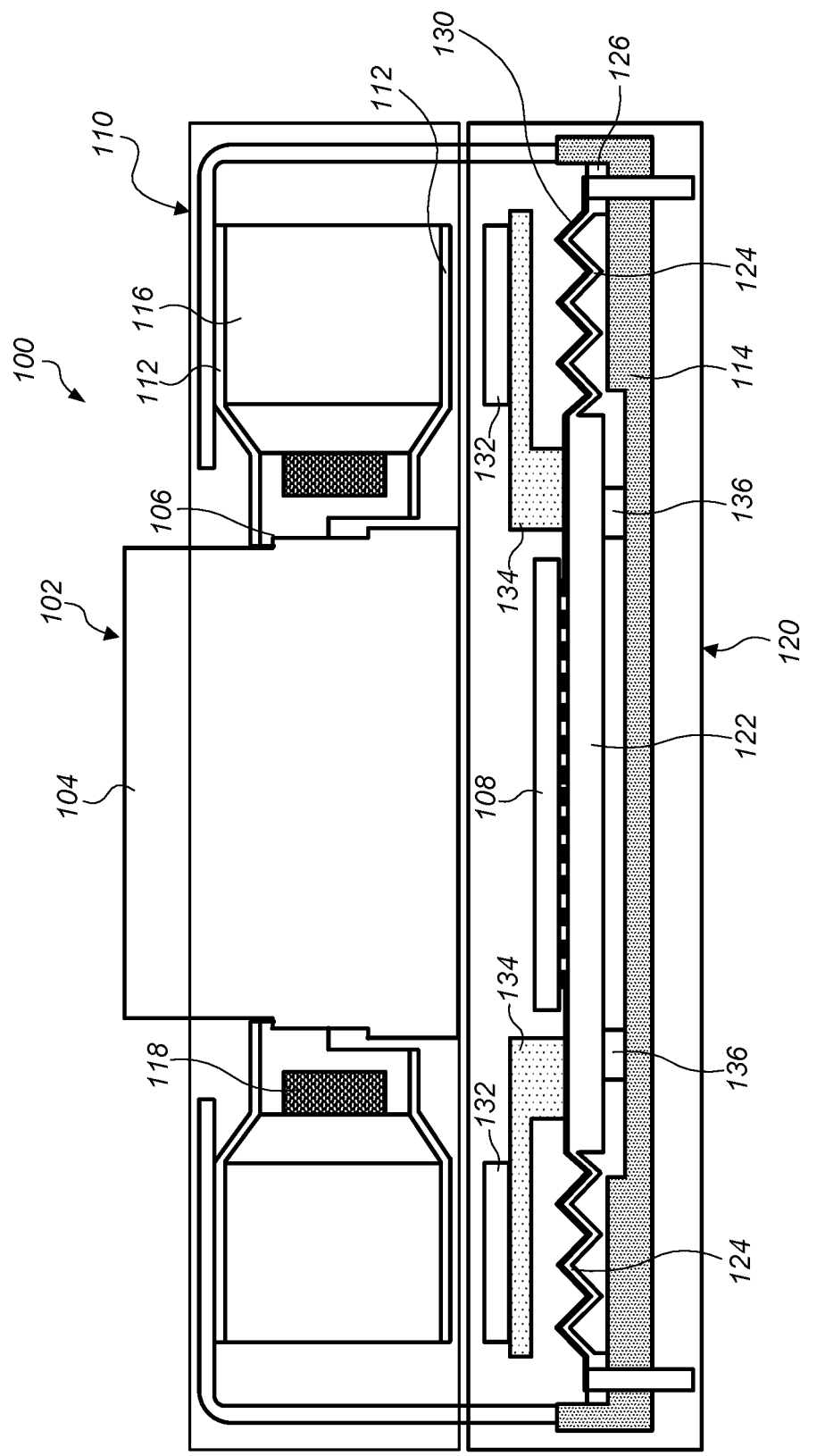
FIGS. 1 and 2 illustrate an example camera having an actuator module or assembly that may, for example, be used to provide autofocus through optics assembly movement and/or optical image stabilization through image sensor movement in small form factor cameras, according to at least some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Introduction to Magnetic Sensing for Autofocus Position Detection

Some embodiments include camera equipment outfitted with controls, magnets, and voice coil motors to improve the effectiveness of a miniature actuation mechanism for a compact camera module. More specifically, in some embodiments, compact camera modules include actuators to deliver functions such as autofocus (AF) and optical image stabilization (OIS). One approach to delivering a very compact actuator for OIS is to use a Voice Coil Motor (VCM) arrangement.

In some embodiments, the optical image stabilization actuator is designed such that the imagining sensor is mounted on an OIS frame which translates in X and Y (as opposed to an autofocus actuator that translates in Z, where Z is the optical axis of the camera). An electro-mechanical component for moving the image sensor is composed of a static and a dynamic platform. Mounting of an imaging sensor (wirebonding, flip/chip, BGA) on the dynamic platform with run out electrical signal traces from the dynamic platform to the static platform provides for connection to the image sensor. In-plane flexures connect the dynamic platform to the static platform and support electrical signal traces. OIS Coils are mounted on the dynamic platform. In some embodiments, OIS permanent magnets are mounted on the static platform to provide additional Lorentz force (e.g. in case of high in-plane flexure stiffness).

Some embodiments include a camera. The camera may include a lens, an image sensor, and a voice coil motor (VCM) actuator. The lens may include one or more lens elements that define an optical axis. The image sensor may be configured to capture light passing through the lens. Furthermore, the image sensor may be configured to convert the captured light into image signals.

In some embodiments, a camera actuator includes an actuator base, an autofocus voice coil motor, and an optical image stabilization voice coil motor. In some embodiments, the autofocus voice coil motor includes a lens carrier mounting attachment moveably mounted to the actuator base, a plurality of shared magnets mounted to the base, and an autofocus coil fixedly mounted to the lens carrier mounting attachment for producing forces for moving a lens carrier in a direction of an optical axis of one or more lenses of the lens carrier. In some embodiments, the optical image stabilization voice coil motor includes an image sensor carrier moveably mounted to the actuator base, and a plurality of optical image stabilization coils moveably mounted to the image sensor carrier within the magnetic fields of the shared magnets, for producing forces for moving the image sensor carrier in a plurality of directions orthogonal to the optical axis.

Some embodiments provide an actuator system using a first AF VCM (voice coil motor), and a second OIS VCM to separately accomplish sensor shift. In some embodiments, the AF VCM actuator allows translation of the optics along the optical axis. In some embodiments, the OIS VCM actuator allows an image sensor to translate in a plane perpendicular to optical axis. In some embodiments, the sensor is mounted on a flat flexure where the electrical traces connecting image sensor and I/O terminals are achieved using an additive metal deposition process (e.g., a high precision additive copper deposition process) directly on the flexure and where the in-plane translation force is a result of a VCM designed around a moving coil architecture.

In some embodiments, the elimination of OIS "optics shift" design that relies on vertical beams (suspension wires) reduces challenges to reliability by relying on the OIS sensor shift and the design of the flat flexure to provide lower required yield strength and larger cross-section, both of which improve reliability.

In some embodiments, shifting the sensor allows reduction of the moving mass, and therefore there is a clear benefit in power consumption in comparison to OIS "optics shift" designs. In some embodiments, manufacturing is accomplished with the electrical traces directly deposited on the OIS flexure (e.g., using an additive metal deposition process), which enables smaller size package while satisfying the I/O requirements.

In some embodiments, the image sensor carrier further includes one or more flexible members for mechanically connecting an image sensor, which is fixed relative to the image sensor carrier, to a frame of the optical image stabilization voice coil motor.

In some embodiments, the image sensor carrier further includes one or more flexible members for mechanically and electrically connecting an image sensor, which is fixed relative to the image sensor carrier, to a frame of the optical image stabilization voice coil motor, and the flexures include electrical signal traces.

In some embodiments, the image sensor carrier further includes one or more flexible members for mechanically and electrically connecting an image sensor, in which is fixed relative to the image sensor carrier, to a frame of the optical image stabilization voice coil motor, and the flexures include metal flexure bodies carrying electrical signal traces electrically isolated from the metal flexure bodies via an insulator (e.g., one or more polymide insulator layers).

In some embodiments, the image sensor carrier further includes one or more flexible members for mechanically and electrically connecting an image sensor, in which is fixed relative to the image sensor carrier, to a frame of the optical image stabilization voice coil motor, and the flexures include metal flexure bodies carrying multiple layers of electrical signal traces electrically isolated from the metal flexure bodies and from one another via an insulator.

In some embodiments, the optical image stabilization coils are mounted on a flexible printed circuit carrying power to the coils for operation of the optical image stabilization voice coil motor.

In some embodiments, the optical image stabilization coils are corner-mounted on a flexible printed circuit mechanically connected to the actuator base and mechanically isolated from the autofocus voice coil motor.

In some embodiments, a bearing surface end stop is mounted to the base for restricting motion of the optical image stabilization voice coil motor.

In some embodiments, a camera includes a lens in a lens carrier, an image sensor for capturing a digital representation of light transiting the lens, an axial motion voice coil motor for focusing light from the lens on the image sensor by moving a lens assembly containing the lens along an optical axis of the lens, and a transverse motion voice coil motor.

In some embodiments, the axial motion voice coil motor includes a suspension assembly for moveably mounting the lens carrier to an actuator base, a plurality of shared magnets mounted to the actuator base, and a focusing coil fixedly mounted to the lens carrier and mounted to the actuator base through the suspension assembly.

In some embodiments, the transverse motion voice coil motor includes an image sensor frame member, one or more flexible members for mechanically connecting the image sensor frame member to a frame of the transverse motion voice coil motor, and a plurality of transverse motion coils moveably mounted to the image sensor frame member within the magnetic fields of the shared magnets, for producing forces for moving the image sensor frame member in a plurality of directions orthogonal to the optical axis.

In some embodiments, the image sensor carrier further includes one or more flexible members for mechanically and electrically connecting an image sensor, in which is fixed relative to the image sensor carrier, to a frame of the optical image stabilization voice coil motor, and the flexures include electrical signal traces.

In some embodiments, the image sensor carrier further includes one or more flexible members for mechanically and electrically connecting an image sensor, in which is fixed relative to the image sensor carrier, to a frame of the optical image stabilization voice coil motor, and the flexures include metal flexure bodies carrying electrical signal traces electrically isolated from the metal flexure bodies via an insulator.

In some embodiments, the optical image stabilization coils are mounted on a flexible printed circuit carrying power to the coils for operation of the optical image stabilization voice coil motor.

In some embodiments, the optical image stabilization coils are corner-mounted on a flexible printed circuit mechanically connected to the actuator base and mechanically isolated from the autofocus voice coil motor.

In some embodiments, a bearing surface end stop is mounted to the base for restricting motion of the optical image stabilization voice coil motor.

In some embodiments, a bearing surface end stop is mounted to the actuator base for restricting motion of the image sensor along the optical axis.

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that some embodiments may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Figure 2:
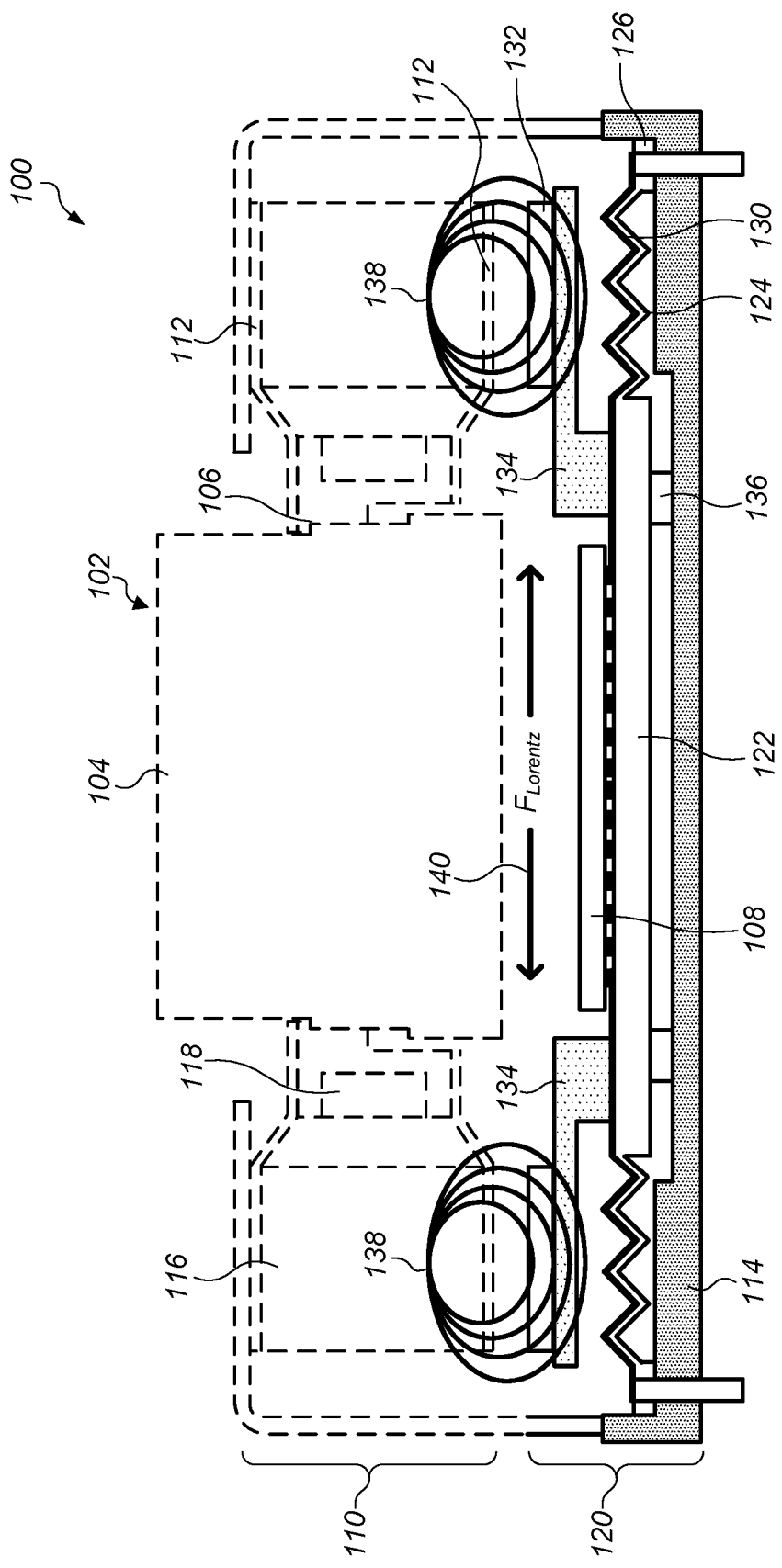

FIGS. 1 and 2 illustrate an example camera 100 having an actuator module or assembly that may, for example, be used to provide autofocus through optics assembly movement and/or optical image stabilization through image sensor movement in small form factor cameras, according to at least some embodiments. Camera 100 may include an optics assembly 102. The optics assembly 102 may carry one or more lenses 104 (also referred to herein as the "lens"). In some cases, the optics assembly may be moveably connected to an actuator base. The lens 104 may be held with a lens barrel, which may in turn be connected to a lens carrier 106, although it should be appreciated that the lens barrel and lens carrier 106 may be a common component in some embodiments. In some embodiments, camera 100 includes an image sensor 108 for capturing a digital representation of light transiting the lens 104. Camera 100 may include an axial motion (autofocus) voice coil motor 110 for focusing light from the lens 104 on the image sensor 108 by moving the optics assembly 102 containing the lens 104 along an optical axis of the lens 104. In some examples, the axial motion voice coil motor 110 includes a suspension assembly 112 for moveably mounting the lens carrier 106 to an actuator base 114. Furthermore, the axial motion voice coil motor 110 may include a plurality of shared magnets 116 mounted to the actuator base 114, and a focusing coil 118 fixedly mounted to the lens carrier 106 and mounted to the actuator base 114 through the suspension assembly 112. In some embodiments, the actuator base 114 can be made from multiple separate components.

In various embodiments, camera 100 includes a transverse motion (optical image stabilization (OIS)) voice coil motor 120. The transverse motion voice coil motor 120 may include an image sensor frame member 122, one or more flexible members 124 (also referred to herein as "flexures", "flexure arms", or "spring arms") for mechanically connecting the image sensor frame member 122 (also referred to herein as the "dynamic platform" or "inner frame") to a frame of the transverse motion voice coil motor 126 (also referred to herein as the "static platform" or "outer frame"), and a plurality of OIS coils 132. As indicated in FIG. 2, the OIS coils 132 may be mounted to the dynamic platform 122 within the magnetic fields 138 of the shared magnets 116, for producing forces 140 for moving the dynamic platform 122 in a plurality of directions orthogonal to the optical axis of the lens 104.

In some embodiments, the dynamic platform 122, the flexures 124 for mechanically connecting the dynamic platform 122 to the static platform 126, and the static platform 126 are a single metal part or other flexible part. In some embodiments, the flexures 124 mechanically and/or electrically connect an image sensor 108, in which is fixed relative to the dynamic platform 122, to the static platform 126, and the flexures 124 include electrical signal traces 130. In some embodiments, the flexures 124 include metal flexure bodies carrying electrical signal traces 130 electrically isolated from the metal flexure bodies via an insulator.

In some examples, the OIS coils 132 are mounted on a flexible printed circuit (FPC) 134 carrying power to the OIS coils 132 for operation of the transverse motion (OIS) voice coil motor 120. The flexible printed circuit 134, the dynamic platform 136, the flexures 124, and/or the static platform 126 may be connected to a top surface of the actuator base 114 in some embodiments.

In some embodiments, a bearing surface end stop 136 is mounted to the actuator base 114 for restricting motion of the image sensor 108 along the optical axis.

For OIS coil control, in some embodiments control circuitry (not shown) may be positioned on the dynamic platform 122 and/or the FPC 134, and power may be routed to the control circuitry via one or more of the flexures 124. In other instances, the control circuitry may be positioned off of the dynamic platform 122, and stimulation signals may be carried to the OIS coils 132 from the control circuitry via one or more of the flexures 124.

Figure 3:
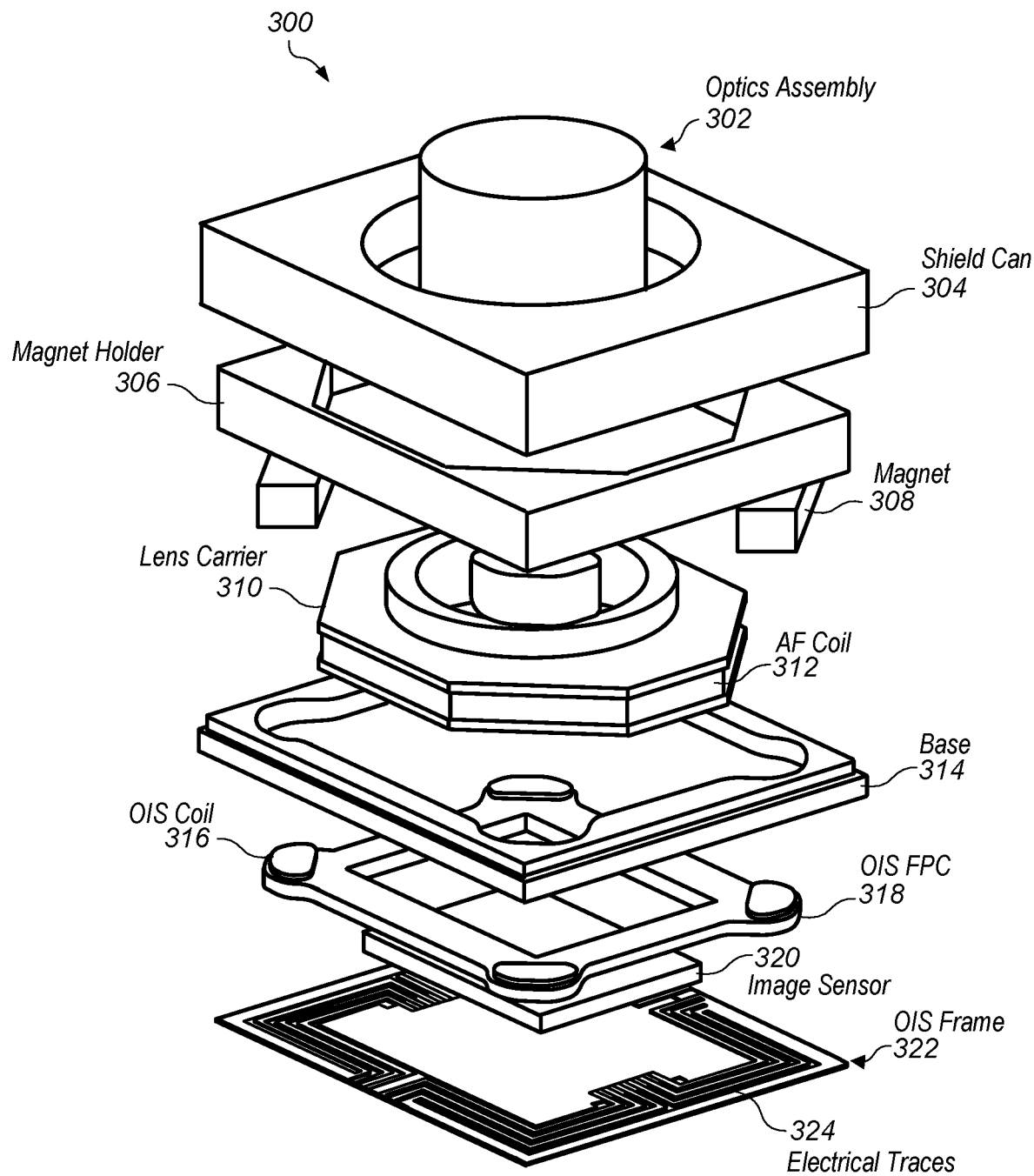
FIGS. 3-5 illustrate components of an example camera having an actuator module or assembly that may, for example, be used to provide autofocus through optics assembly movement and/or optical image stabilization through image sensor movement in small form factor cameras, according to at least some embodiments.
Figure 4:
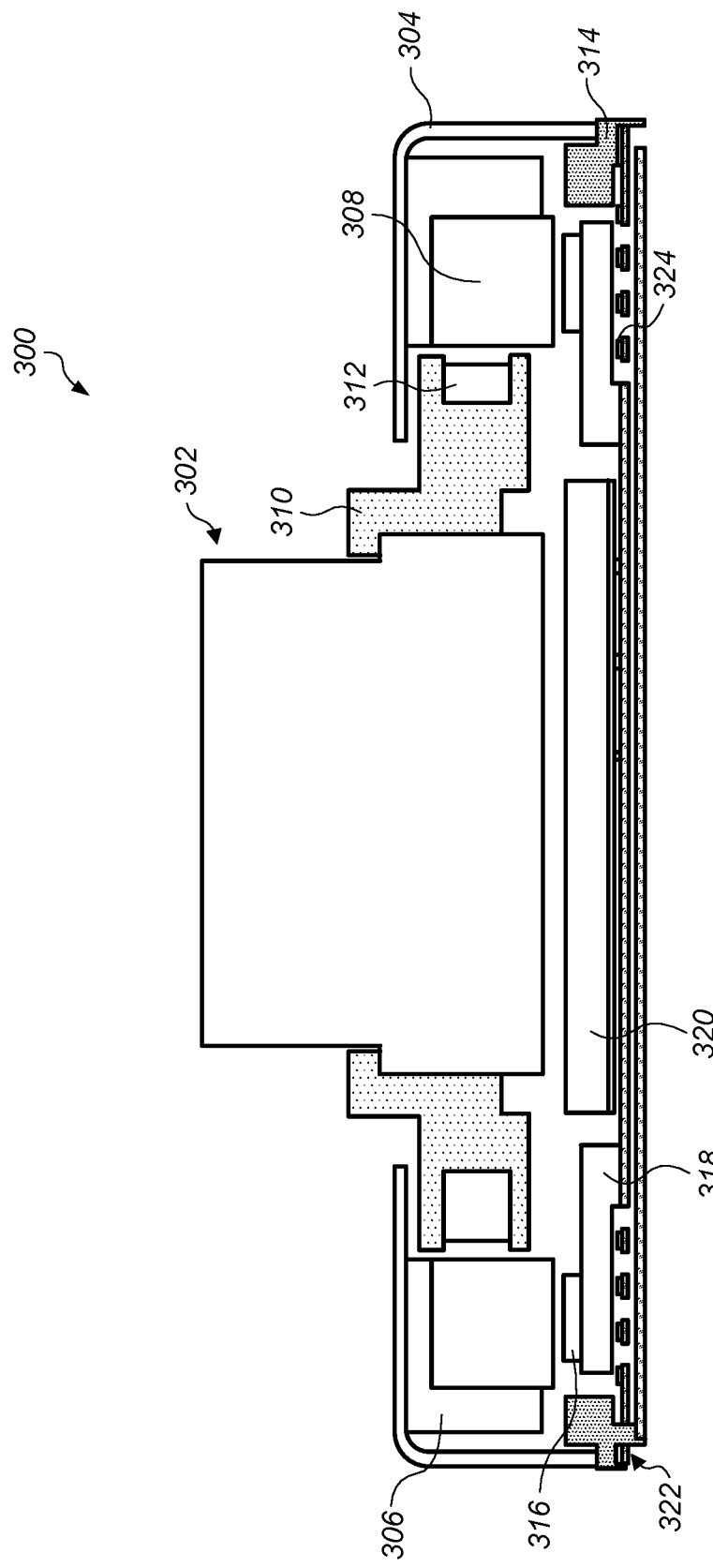
Figure 5:
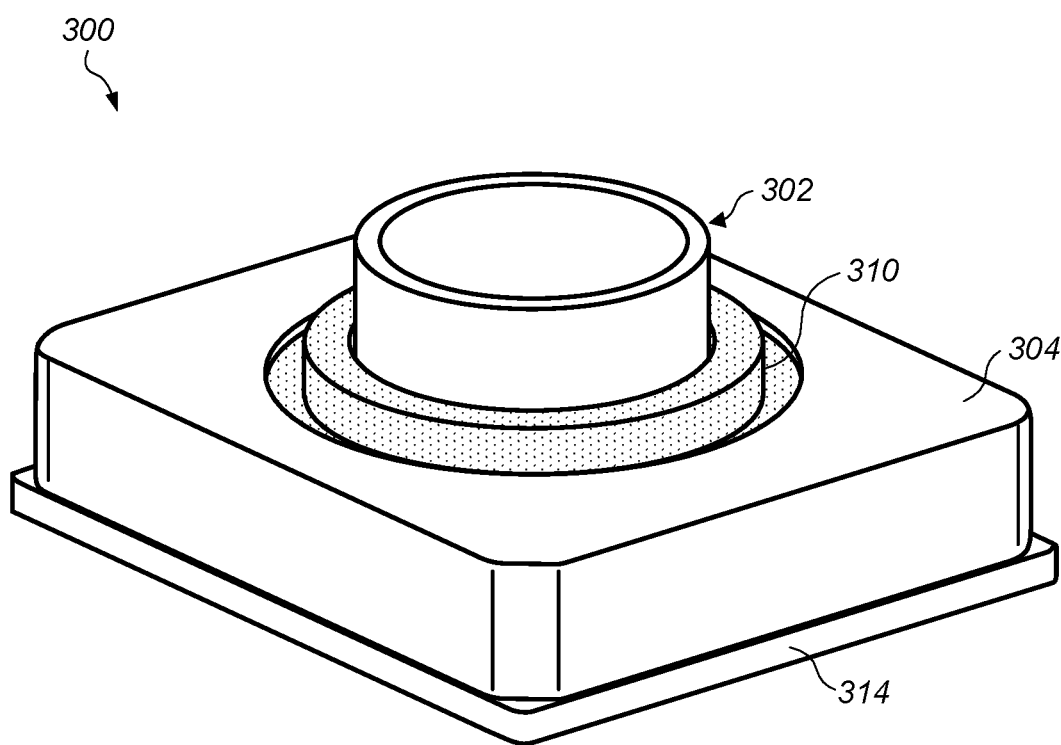

FIGS. 3-5 illustrate components of an example camera 300 having an actuator module or assembly that may, for example, be used to provide autofocus (AF) through optics assembly movement and/or optical image stabilization (OIS) through image sensor movement in small form factor cameras, according to at least some embodiments. FIG. 3 shows an exploded view of the camera 300. FIG. 4 shows a cross-sectional view of the camera 300. FIG. 5 shows a perspective view of the exterior of the camera 300. In various embodiments, the camera 300 may include an optics assembly 302, a shield can 304, a magnet holder 306, a magnet 308, a lens carrier 310, an AF coil 312, a base 314, an OIS coil 316, an OIS FPC 318, an image sensor 320, an OIS frame 322 (e.g., in accordance with one or more embodiments of the flexure modules described herein with reference to FIGS. 7A-11B), and/or electrical traces 324.

In various examples, the shield can 304 may be mechanically attached to the base 314. The camera 300 may include an axial motion (AF) voice coil motor (VCM) (e.g., axial motion VCM 110 discussed above with reference to FIGS. 1 and 2) and/or a transverse motion (OIS) VCM (e.g., transverse motion VCM 120 discussed above with reference to FIGS. 1 and 2). In some cases, the axial motion VCM may include the optics assembly 302, the magnet holder 306, the magnet 308, the lens carrier 310, and/or the AF coil 312. Furthermore, the transverse motion VCM may include the OIS coil 316, the OIS FPC 318, the image sensor 320, the OIS frame 322, and/or the electrical traces 324. In some examples, the axial motion VCM (or a portion thereof) may be connected to the shield can 304, while the transverse motion VCM (or a portion thereof) may be connected to the base 314.

In some embodiments, the OIS FPC 318 and/or the OIS frame 322 may be connected to a bottom surface of the base 314. In some examples, the base 314 may define one or more recesses and/or openings having multiple different cross-sections. For instance, a lower portion of the base 314 may have may define a recess and/or an opening with a cross-section sized to receive the OIS frame 322. An upper portion of the base 314 may define a recess and/or an opening with a cross-section sized to receive the OIS FPC 318. The upper portion may have an inner profile corresponding to the outer profile of the OIS FPC 318. This may help to maximize the amount of material included in the base 314 (e.g., for providing structural rigidity to the base 314) while still providing at least a minimum spacing between the OIS FPC 318 and the base 314.

In some non-limiting examples, the OIS FPC 318 and the image sensor 320 may be separately attached to the OIS frame 322. For instance, a first set of one or more electrical traces may be routed between the OIS FPC 318 and the OIS frame 322. A second, different set of one or more electrical traces may be routed between the image sensor and the OIS frame 322. In other embodiments, the image sensor 320 may be attached to or otherwise integrated into the OIS FPC 318, such that the image sensor 320 is connected to the OIS frame 322 via the OIS FPC 318, e.g., as discussed below with reference to FIG. 6.

Figure 6:
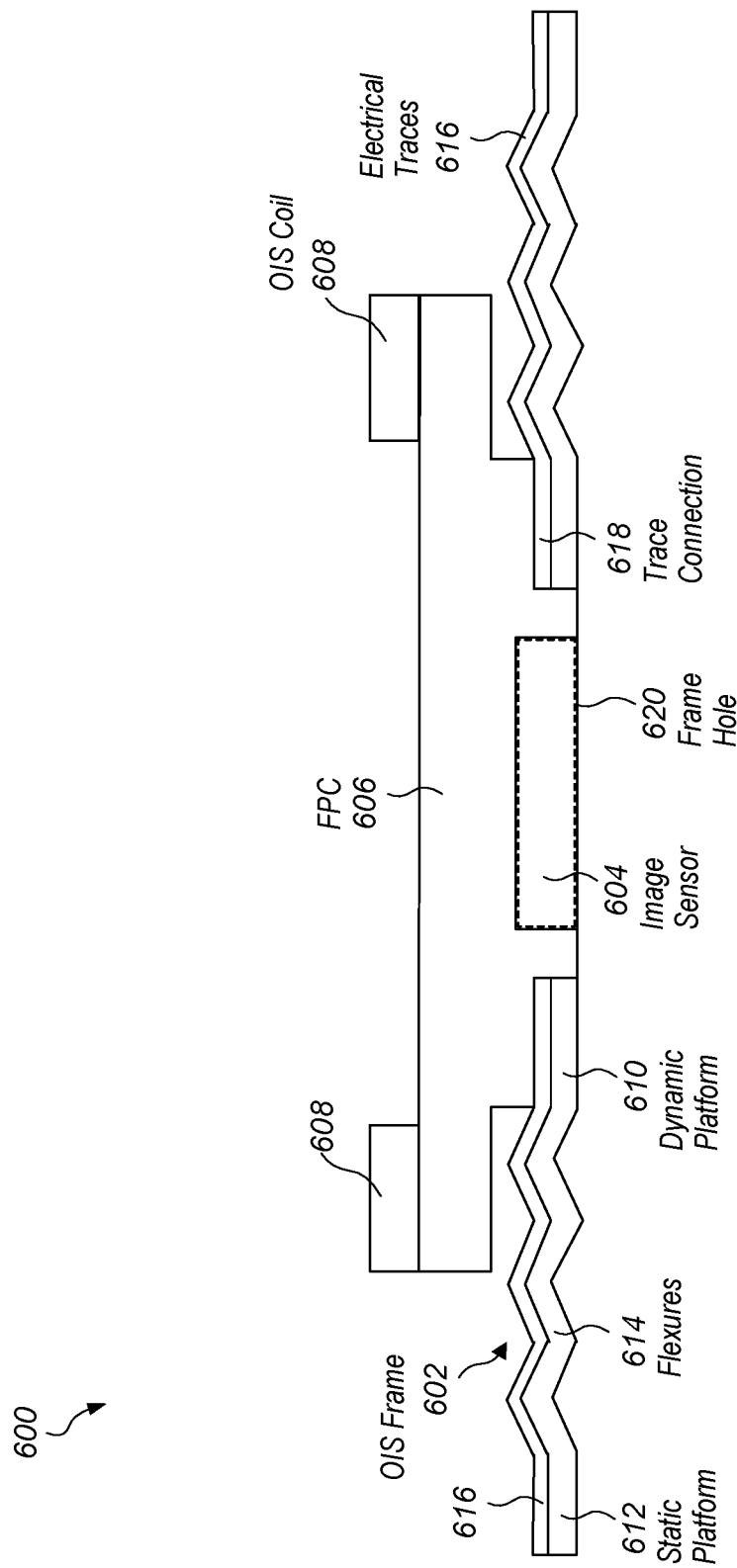
FIG. 6 illustrates a cross-sectional view of an example transverse motion voice coil motor (VCM) that may be used, for example, in a camera to provide optical image stabilization, in accordance with some embodiments.

FIG. 6 illustrates a cross-sectional view of an example transverse motion voice coil motor (VCM) 600 that may be used, for example, in a camera to provide optical image stabilization (OIS), in accordance with some embodiments. In some embodiments, the transverse motion VCM 600 may include an OIS frame 602, an image sensor 604, an OIS flat printed circuit (FPC) 606, and/or an OIS coil 608. The OIS frame 602 may include a dynamic platform 610, a static platform 612, and one or more flexures 614. The flexures 614 may connect the dynamic platform 610 to the static platform 612. In some examples, one or more of the flexures 614 may include one or more electrical traces 616 routed between the static platform 612 and the dynamic platform 610 and/or the OIS FPC 606.

In some embodiments, the image sensor 604 may be attached to or otherwise integrated into the OIS FPC 606 such that the image sensor 604 is connected to the OIS frame 602 via the OIS FPC 606, e.g., as depicted in FIG. 6. In some examples, there may be one or more trace connections 618 between the OIS FPC 606 and the OIS frame 602. In some cases, the OIS frame 602 may have a hole 620 extending therethrough, and a portion of the OIS FPC 606 and/or the image sensor 604 may extend at least partially through the hole 620. This may allow for a reduction in z height (e.g., the height of the transverse motion VCM 600 along an optical axis of the camera) in some cases.

In some examples, the OIS FPC 606 may extend from the dynamic platform 610 such that a portion of the OIS FPC 606 is positioned over the flexures 614 (e.g., in a plane above the flexures 614). In some examples, at least a portion of each of the OIS coils 608 to be positioned above the flexures 614. Such an arrangement may facilitate miniaturization of the transverse motion VCM 600 and/or the camera, as the dynamic platform 610 need not be sized to accommodate both the image sensor 604 and the OIS coils 608.

Figure 7A:
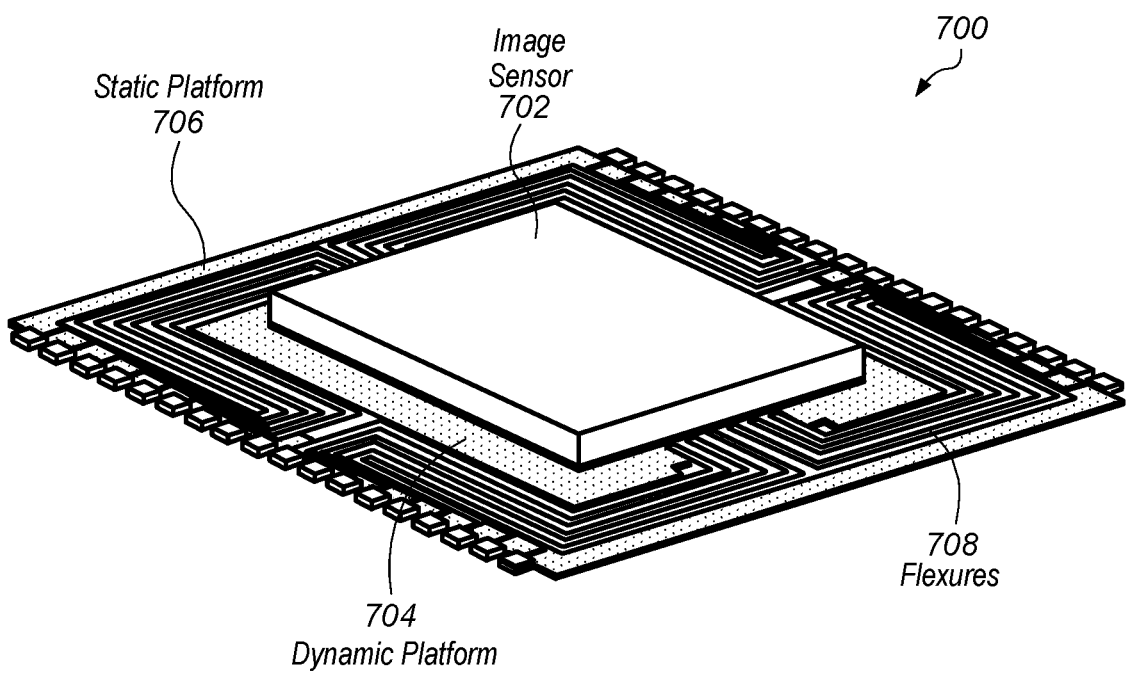
FIGS. 7A-7C depict an example embodiment of frames and flexures of a camera having an actuator module or assembly that may, for example, be used to provide autofocus through optics assembly movement and/or optical image stabilization through image sensor movement in small form factor cameras, according to at least some embodiments.
Figure 7A:
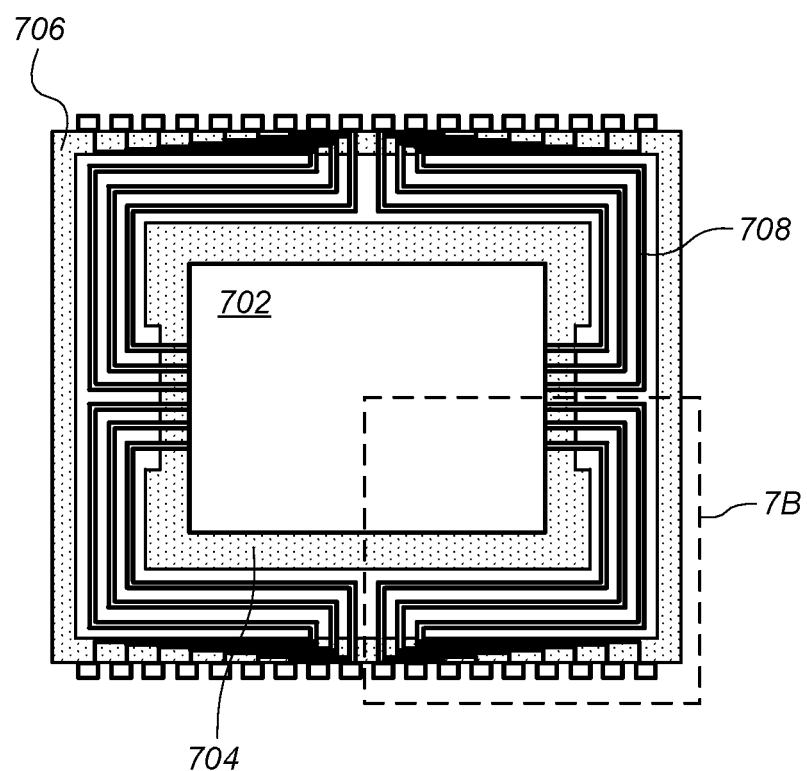
Figure 7B:
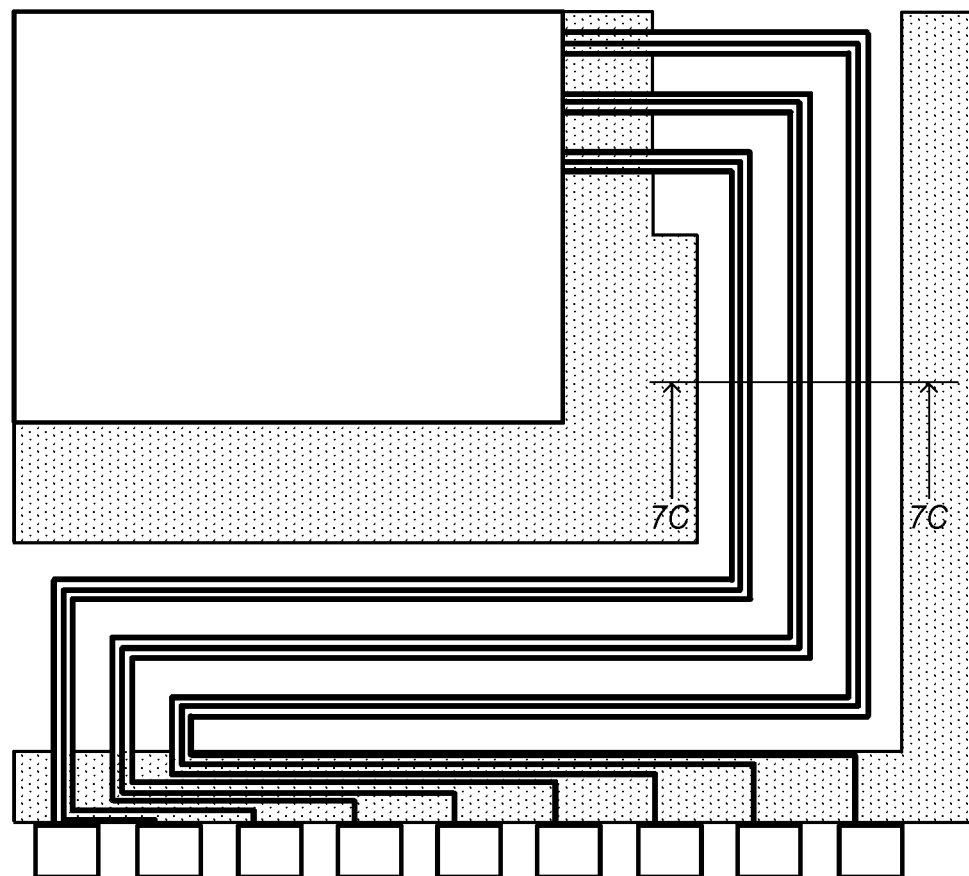
Figure 7C:
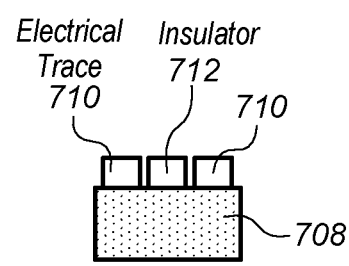

FIGS. 7A-7C depict an example embodiment of frames and flexures 700 of a camera having an actuator module or assembly that may, for example, be used to provide auto-focus through optics assembly movement and/or optical image stabilization through image sensor movement in small form factor cameras, according to at least some embodiments. An image sensor 702 rests on, or is otherwise coupled to, a dynamic platform 704 of an OIS frame connected to a static platform 706 of the OIS frame by flexures 708 carrying electrical traces 710. The traces 710 may be electrically insulated (e.g., from each other, from other flexures 708, from the OIS frame, etc.) via an insulator 712, e.g., as indicated in FIG. 7C. The traces 710 may be formed from a metal material (e.g., copper). In some examples, the traces 710 may be formed using an additive metal deposition process, such as an additive copper deposition process. Similarly, the insulator 712 may be made from polyimide.

In some embodiments, the OIS frame may include multiple flexure groups. Each flexure group may be multiple flexures 708 that are connected to a common side of the dynamic platform 704 and a common side of the static platform 706. In some examples, at least one flexure group is configured such that the flexures 708 connect to a side of the dynamic platform 704 and a non-corresponding side of the static platform 706. That is, the each side of the dynamic platform 704 may face a corresponding side of the static platform 706, and the flexure 708 may include at least one bend or curve to traverse a corner to reach a non-corresponding side of the static platform 706, e.g., as depicted in FIGS. 7A and 7B.

In some cases, one or more sides of the dynamic platform 704 and/or the static platform 706 may include multiple flexure groups. For instance, as shown in FIG. 7A, a first side of the dynamic platform 704 may include two flexure groups. One flexure group may connect the first side of the dynamic platform 704 to a first non-corresponding side of the static platform 706, while the other flexure group may connect the first side of the dynamic platform 704 to a second non-corresponding side of the static platform 706. In some cases, the first non-corresponding side and the second non-corresponding side of the static platform 706 may be opposite each other. A second side of the dynamic platform 704 may include two flexure groups that are connected in a similar manner to the static platform 706. In some cases, the first side and the second side of the dynamic platform 704 may be opposite each other.

Figure 8A:
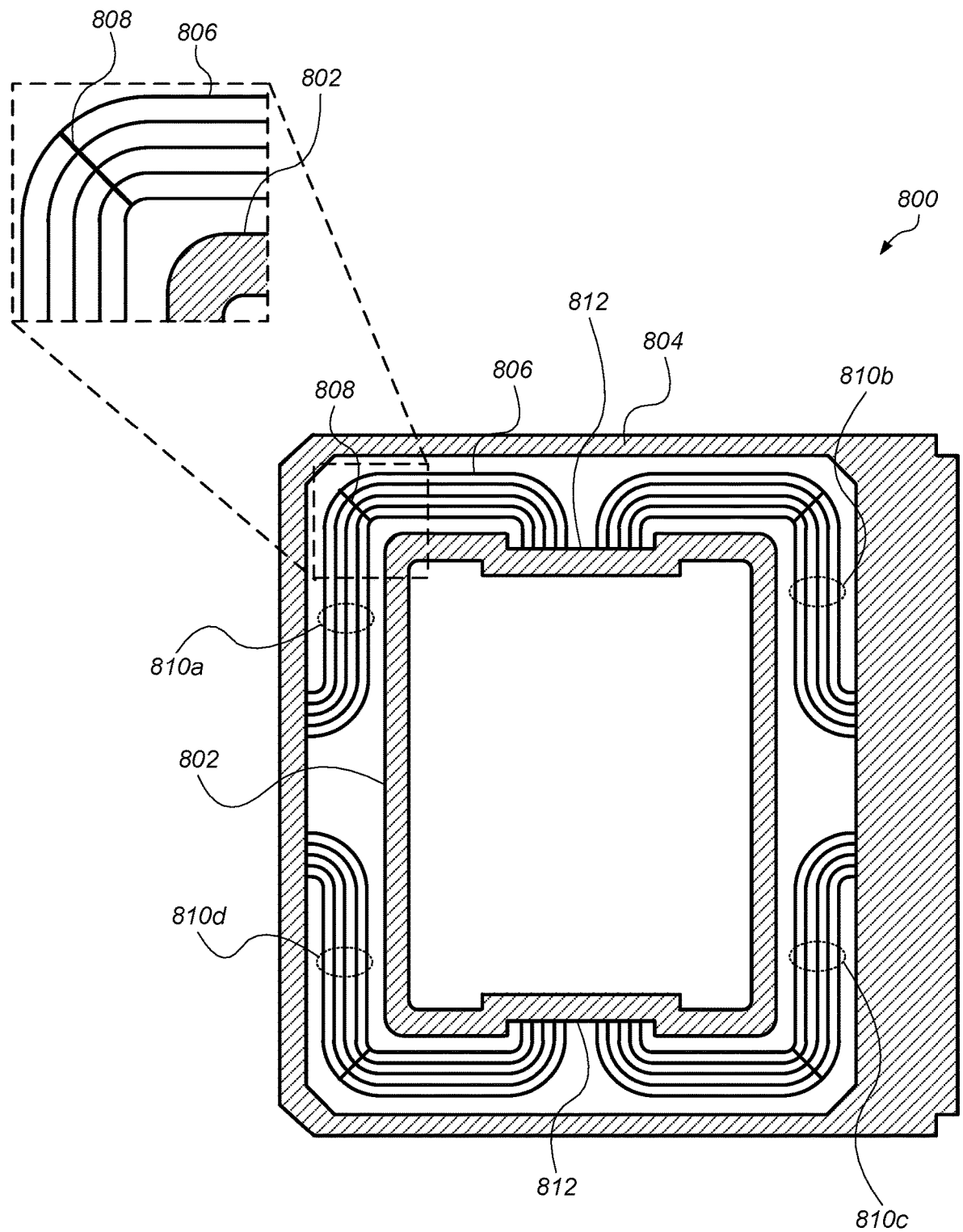
FIGS. 8A-8B each illustrate a view of an example flexure module of a voice coil motor (VCM) actuator that may be used, for example, in a camera to provide optical image stabilization, in accordance with some embodiments.
Figure 8B:
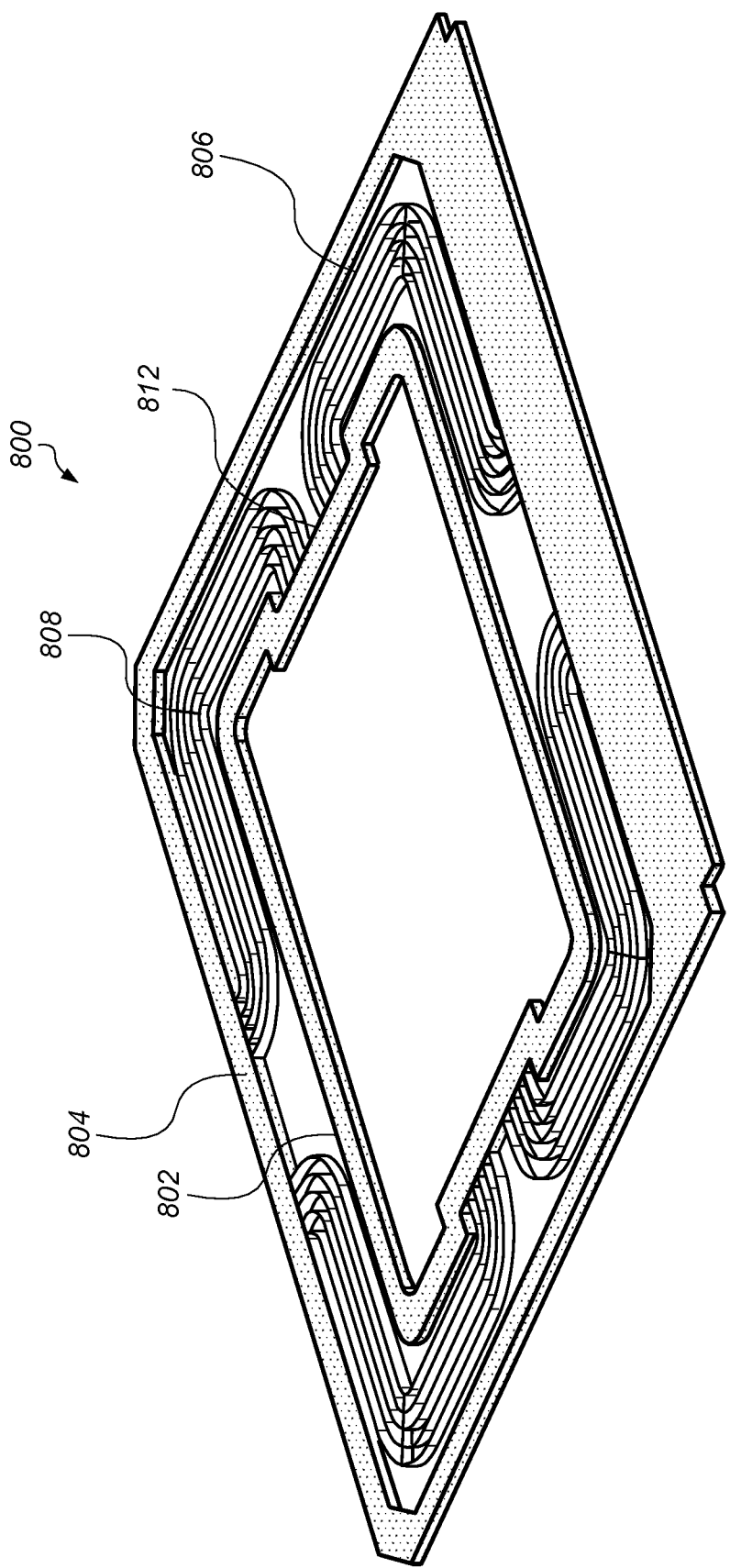

FIGS. 8A-8B each illustrate a view of an example flexure module 800 of a voice coil motor (VCM) actuator that may be used, for example, in a camera to provide optical image stabilization, in accordance with some embodiments. FIG. 8A illustrates a top view of the flexure module 800. FIG. 8B illustrates a perspective view of the flexure module 800.

In some embodiments, the flexure module 800 may be used in a transverse motion (optical image stabilization) voice coil motor of a camera (e.g., the cameras described above with reference to FIGS. 1-5). The flexure module 800 may include a dynamic platform 802 and a static platform 804. In some examples, the dynamic platform 802 and/or the static platform 804 may be configured in accordance with one or more embodiments described herein with reference to FIGS. 1-7C and 9A-13. However, various other configurations of the dynamic platform 802 and/or the static platform 804 that are suitable for use with a VCM actuator fall within the scope of this disclosure.

In various examples, the flexure module 800 may include one or more flexures 806. The flexures 806 may be configured to mechanically connect the dynamic platform 802 to the static platform 804. The flexures 806 may be configured to provide stiffness (e.g., in-plane flexure stiffness) to the VCM actuator while allowing the dynamic platform 802 (and an image sensor fixed relative to the dynamic platform 802) to move along a plane that is orthogonal to an optical axis defined by one or more lenses of a camera. In this manner, the image sensor may be shifted along the plane that is orthogonal to the optical axis to provide optical image stabilization functionality. Furthermore, as described herein with reference to FIGS. 1-7C, 10B-10E, 11A-11B, and 13, one or multiple flexures 806 may include electrical traces configured to convey signals (e.g., image signals generated by the image sensor fixed relative to the dynamic platform 802) from the dynamic platform 802 to the static platform 804.

In various embodiments, the flexure module 800 may include one or more flexure stabilizer members 808. The flexure stabilizer members 808 may be configured to mechanically connect flexures 806 to each other such that the flexure stabilizer members 808 prevent interference between the flexures 806 that are connected by the flexure stabilizer members 808. For instance, the flexure stabilizer members 808 may be configured to prevent the flexures 806 from colliding and/or entangling with one another, e.g., in drop events, vibration events, etc. Additionally, or alternatively, the flexure stabilizer members 808 may be configured to limit motion of, and/or stabilize relative motion between, the flexures 806 that are connected by the flexure stabilizer members 808. Furthermore, the flexure stabilizer members 808 may be arranged along various portions of the flexures 806 to provide in-plane stiffness as needed in the flexure module 800, e.g., to satisfy optical image stabilization design requirements. Some non-limiting examples of flexure stabilizer member configurations are described below with reference to FIGS. 9A-9L.

In some embodiments, the flexures 806 may be arranged in one or more flexure groups 810, or arrays, that individually include multiple flexures 806. For instance, as depicted in FIGS. 8A-8B, the flexure module 800 includes a first flexure group 810a, a second flexure group 810b, a third flexure group 810c, and a fourth flexure group 810d. In some examples, the flexures 806 of a flexure group 810 may be parallel to each other along a plane that is orthogonal to the optical axis. In some cases, the flexures 806 of one flexure group 810 (e.g., the first flexure group 810a) may not be parallel to the flexures 806 of another flexure group 810 (e.g., the second flexure group 810b). In some cases, one or more of the flexure groups 810 may include one or more flexure stabilizer members 808. For instance, each of the flexure groups 810 may include one or more flexure stabilizer members 808. Furthermore, one or more of the flexure groups 810 may include one or more bend (or "turn") portions. In some cases, at least one of the flexure groups 810 may include a flexure stabilizer member 808 disposed at a bend portion. For example, in FIGS. 8A-8B, each of the flexure groups 810 bend at three respective bend portions, and a respective flexure stabilizer member 808 connects the flexures 806 of respective flexure groups 810 at one respective bend portion of the three respective bend portions.

In some examples, the dynamic platform 802 and/or the static platform 804 may include one or more offsets 812 (e.g., a recess, an extension, etc.). In some cases, one or more flexures 806 may connect to the dynamic platform 802 and/or the static platform 804 at an offset 812. For instance, as illustrated in FIGS. 8A-8B, the dynamic platform 802 may include two recess offsets 812 at opposing sides of the dynamic platform 802. However, in some embodiments, the dynamic platform 802 and/or the static platform 804 may include a different offset configuration. Some non-limiting examples of offset configurations are described below with reference to FIGS. 9A-9L.

FIGS. 9A-9L each illustrate a partial top view of a respective example flexure module configuration, in accordance with some embodiments. In some cases, one or more embodiments of the example flexure module configurations of FIGS. 9A-9L may be used in a flexure module (e.g., the flexure modules described herein with reference to FIGS. 8A-8B and 11A-12B) of a voice coil motor (VCM) actuator. The VCM actuator may be used, for example, in a camera (e.g., the cameras described above with reference to FIGS. 1-5) to provide optical image stabilization.

The example flexure module configurations of FIGS. 9A-9L provide some non-limiting examples of design feature variations that may be used in one or more embodiments of the flexure modules, VCM actuators, and/or cameras described herein.

Figure 9A:
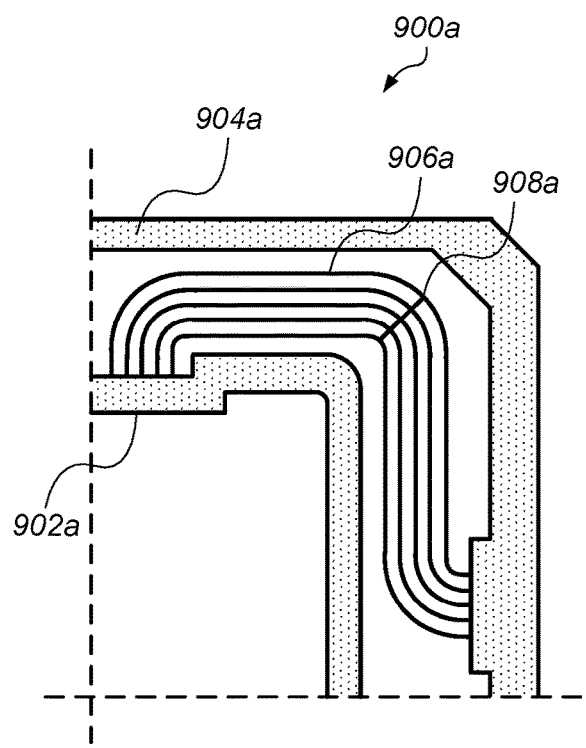
FIGS. 9A-9L each illustrate a partial top view of a respective example flexure module configuration, in accordance with some embodiments. In some cases, one or more embodiments of the example flexure module configurations of FIGS. 9A-9L may be used in a flexure module of a voice coil motor (VCM) actuator. The VCM actuator may be used, for example, in a camera to provide optical image stabilization.

FIG. 9A illustrates a partial top view of a flexure module configuration 900a, in accordance with some embodiments. The flexure module configuration 900a includes a dynamic platform 902a, a static platform 904a, flexures 906a, and a flexure stabilizer member 908a. The flexures 906a may be part of a flexure group that extends from the dynamic platform 902a to the static platform 904a. A side of the dynamic platform 902a may define a recess at which the flexures 906a are attached to the dynamic platform 902a. A non-corresponding side of the static platform 904a may define an extension at which the flexures 906a are attached to the static platform 904a. In its extension from the recess of the dynamic platform 902a to the extension of the static platform 904a, the flexure group may include one or more bends. For instance, the flexure group may include a first bend to traverse a first corner formed by the recess of the dynamic platform 902a, a second bend to traverse a corner adjacent two sides of the dynamic platform 902a, and a third bend to orient the flexure group towards the extension of the static platform 904a. In some examples, a respective portion of the flexure group may be oriented orthogonal to the recess of the dynamic platform 902a and/or orthogonal to the extension of the static platform 904a at or near respective connection locations. In some embodiments, the recess of the dynamic platform 902a may allow for an increased length of the flexures 906a, which in turn may provide for additional flexibility for the flexures 906a.

Figure 9C:
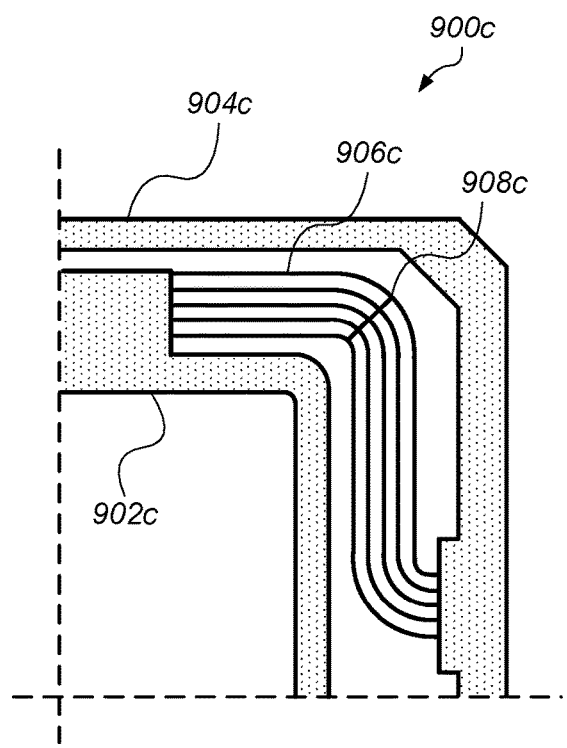
Figure 9B:
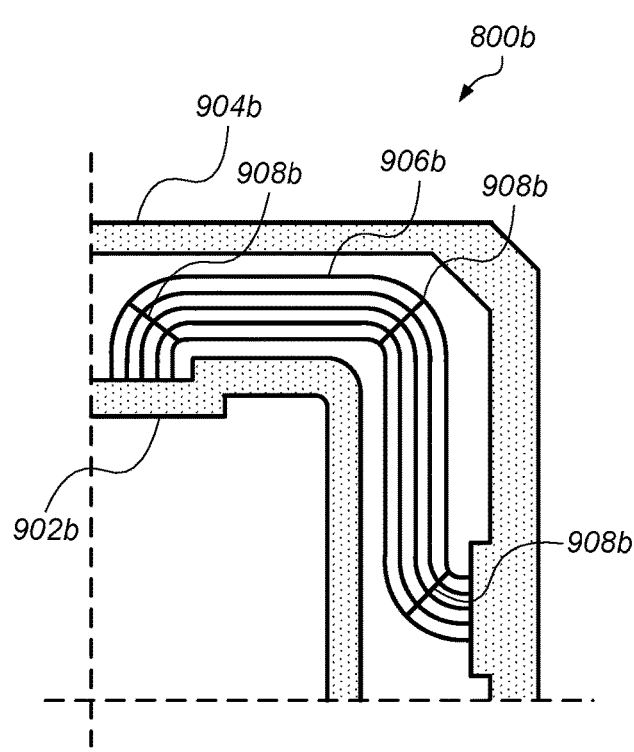

FIG. 9B illustrates a partial top view of a flexure module configuration 900b, in accordance with some embodiments. The flexure module configuration 900b includes a dynamic platform 902b, a static platform 904b, flexures 906b, and flexure stabilizer members 908b. In some embodiments, the dynamic platform 902b, the static platform 904b, and the flexures 906b may be configured like the dynamic platform 902a, the static platform 904a, and the flexures 906a, respectively, described above with reference to FIG. 9A. However, the flexure module configuration 900b may include multiple flexure stabilizer members 908b. For instance, each bend of the flexure group may include a respective flexure stabilizer member 908b.

FIG. 9C illustrates a partial top view of a flexure module configuration 900c, in accordance with some embodiments. The flexure module configuration 900c includes a dynamic platform 902c, a static platform configuration 904c, flexures 906c, and a flexure stabilizer member 908c. The flexures 906c may be part of a flexure group that extends from the dynamic platform 902c to the static platform 904c. A side of the dynamic platform 902c may define a first extension at which the flexures 906c are attached to the dynamic platform 902c. A non-corresponding side of the static platform 904c may define a second extension at which the flexures 906c are attached to the static platform 904c. In its extension from the first extension of the dynamic platform 902c to the second extension of the static platform 904c, the flexure group may include one or more bends. For instance, the flexure group may include a first bend to traverse a corner adjacent two sides of the dynamic platform 902c, and a second bend to orient the flexure group towards the second extension of the static platform 904c. In some embodiments, the first extension of the dynamic platform 902c may allow for a reduced length of the flexures 906c and/or a reduced number of bends of the flexures 906c, which in turn may provide for increased stiffness of the flexures 906c.

In some embodiments, an extension and/or a recess of a dynamic platform and/or a static platform may change the direction that the flexures attach relative to the dynamic platform and/or the static platform. For example, in FIG. 8C, the flexures 906c are connected to the second extension of the static platform 904c such that the flexures 906c extend from the second extension in a direction toward a corresponding side of the dynamic platform 902c (and thus the flexures 906c bend to avoid contact with the corresponding side of the dynamic platform 902c) while the flexures 906c are connected to the first extension of the dynamic platform 902c in a direction toward a non-corresponding side of the static platform 904c (and thus the flexures 906c do not need a bend to avoid contact with the corresponding side of the static platform 904c).

In some examples, the second extension of the static platform 904c may be used to provide additional space for routing of traces (e.g., for grounding of guard traces, as discussed below with reference to FIG. 10O).

Figure 9D:
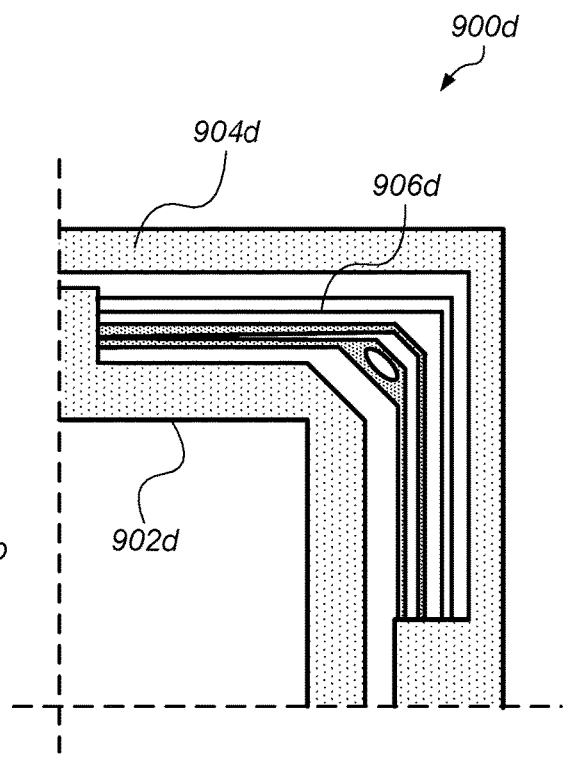

FIG. 9D illustrates a partial top view of a flexure module configuration 900d, in accordance with some embodiments. The flexure module configuration 900d includes a dynamic platform 902d, a static platform 904d, and flexures 906d. The flexures 906d may be part of a flexure group that extends from the dynamic platform 902d to the static platform 904d. A side of the dynamic platform 902d may define a first extension at which the flexures 906d are attached to the dynamic platform 902d. A non-corresponding side of the static platform 904d may define a second extension at which the flexures 906d are attached to the static platform 904d. In its extension from the first extension of the dynamic platform 902d to the second extension of the static platform 904d, the flexure group may include one or more bends. For instance, the flexure group may include a bend to traverse a corner (which may include, e.g., a chamfer, fillet, etc.) adjacent two sides of the dynamic platform 902d. In some embodiments, the first extension of the dynamic platform 902d may allow for a reduced length of the flexures 906d and/or a reduced number of bends of the flexures 906d, which in turn may provide for increased stiffness of the flexures 906d.

In some examples, certain electrical traces (and the signals they carry) may be susceptible to physical deformations. In instances where different electrical traces have different thicknesses and/or strengths, the electrical traces may be routed along different flexures 906d and/or different types of flexures 906d, e.g., based at least in part on sensitivity of the electrical traces. For example, in FIG. 9D, the flexure group may include flexures 906d of varying shapes and/or thicknesses. From outermost flexure 906d to innermost flexure 906d, the first (outermost) flexure 906d and second flexure 906d have a first shape and a first thickness that is consistent throughout the flexures, the third flexure 906d has a second shape and a second thickness that varies at different portions of the flexure, and the fourth (innermost) flexure 906d has a third shape and a third thickness that varies at different portions of the flexure. In some cases, the first shape, the second shape, and/or the third shape may be different from one another. In some embodiments, each of the second shape and the third shape may include a respective bend that is chamfered. In some instances, the fourth (innermost) flexure 906d may include a chamfered bend proximate a chamfered corner of the dynamic platform 902d. Furthermore, the fourth (innermost) flexure 906d may define a through hole at or proximate the chamfered bend.

Figure 9E:
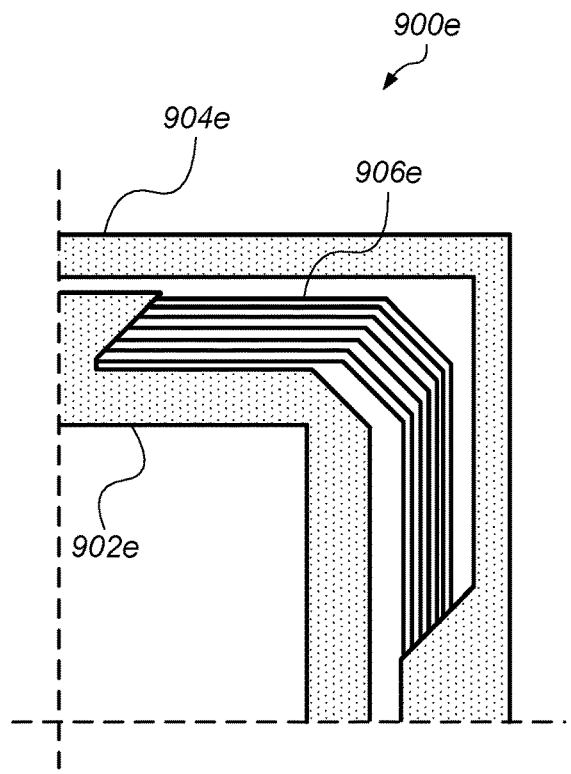

FIG. 9E illustrates a partial top view of a flexure module configuration 900e, in accordance with some embodiments. The flexure module configuration 900e includes a dynamic platform 902e, a static platform 904e, and flexures 906e.

Figure 9G:
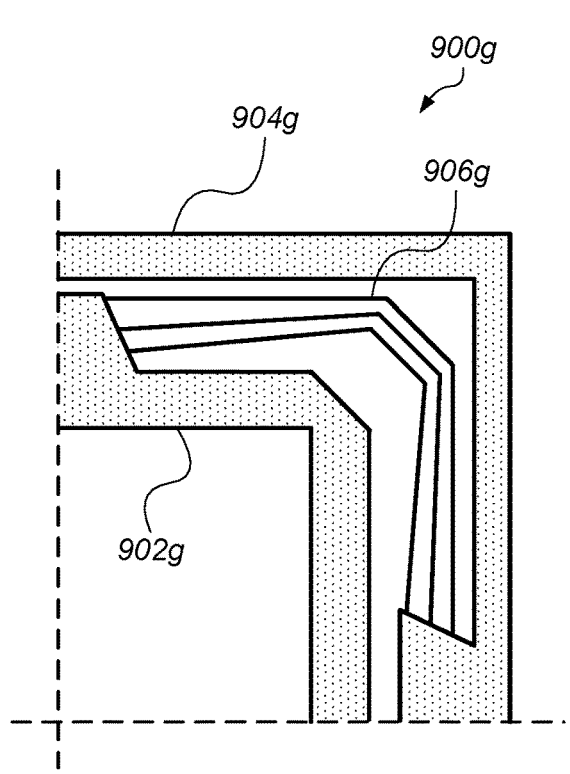
Figure 9F:
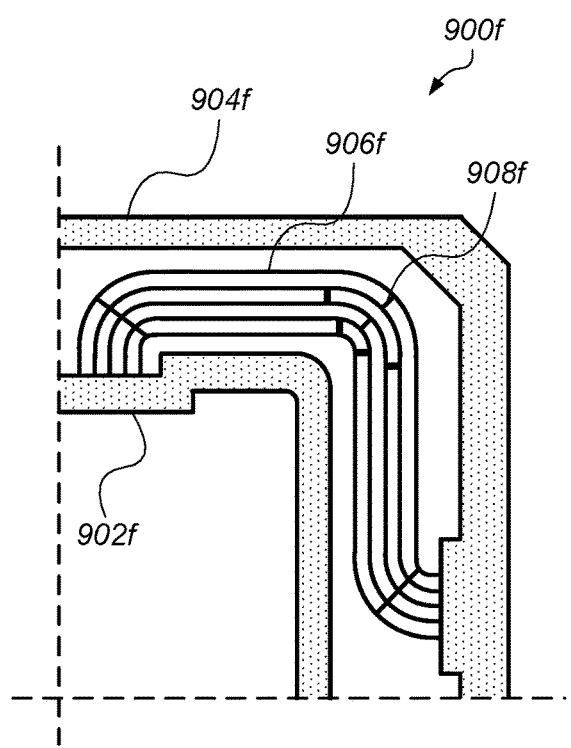

FIG. 9F illustrates a partial top view of a flexure module configuration 900f, in accordance with some embodiments. The flexure module configuration 900f includes a dynamic platform 902f, a static platform 904f, flexures 906f, and flexure stabilizer members 908f.

FIG. 9G illustrates a partial top view of a flexure module configuration 900g, in accordance with some embodiments. The flexure module configuration 900g includes a dynamic platform 902g, a static platform 904g, and flexures 906g.

Figure 9H:
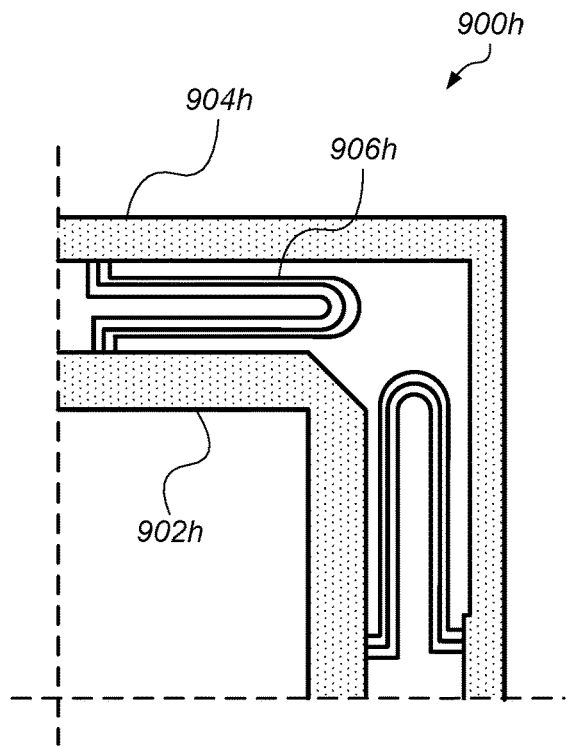

FIG. 9H illustrates a partial top view of a flexure module configuration 900h, in accordance with some embodiments. The flexure module configuration 900h includes a dynamic platform 902h, a static platform 904h, and flexures 806h.

Figure 9I:
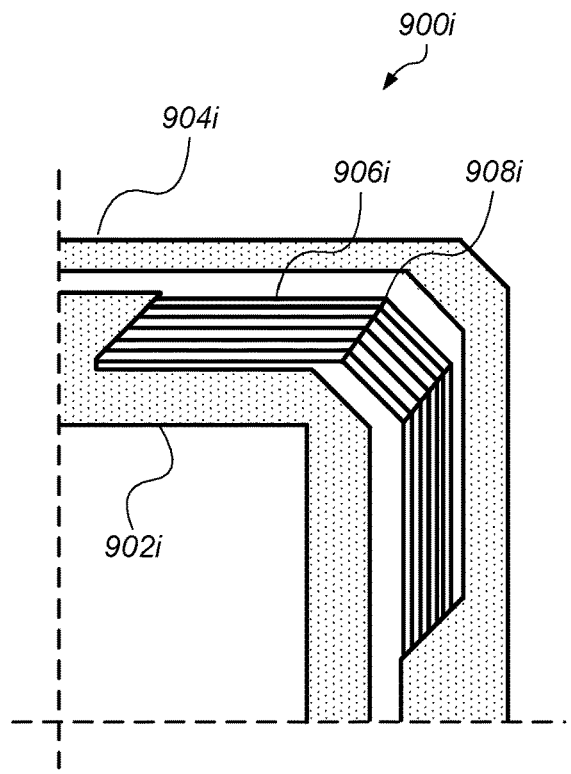

FIG. 9I illustrates a partial top view of a flexure module configuration 900i, in accordance with some embodiments. The flexure module configuration 900i includes a dynamic platform 902i, a static platform 904i, flexures 906i, and flexure stabilizer members 908i. In some embodiments, the static platform 904i may include a chamfered corner proximate the outermost flexure 906i. In some instances, the inner surface of the static platform 904i may have a profile that follows the profile of the flexures 906i as well as at least a portion of the outer profile of the dynamic platform 902i. Such an arrangement may be used to provide at least a minimum spacing between the flexures 906i and the dynamic platform 902i and/or the static platform 904i. It should be appreciated that the components may have different profiles, but some other profiles may reduce useable area of the dynamic platform and/or the static platform, and/or increase the overall size of an OIS frame.

Figure 9K:
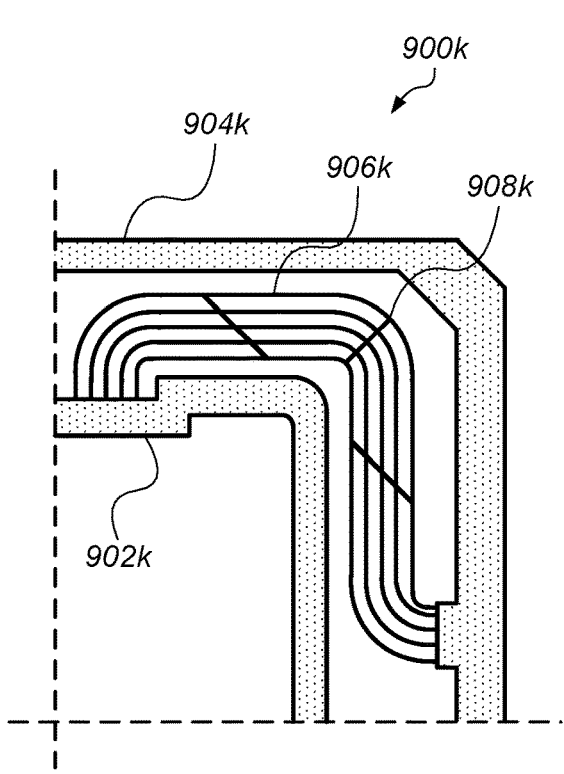
Figure 9J:
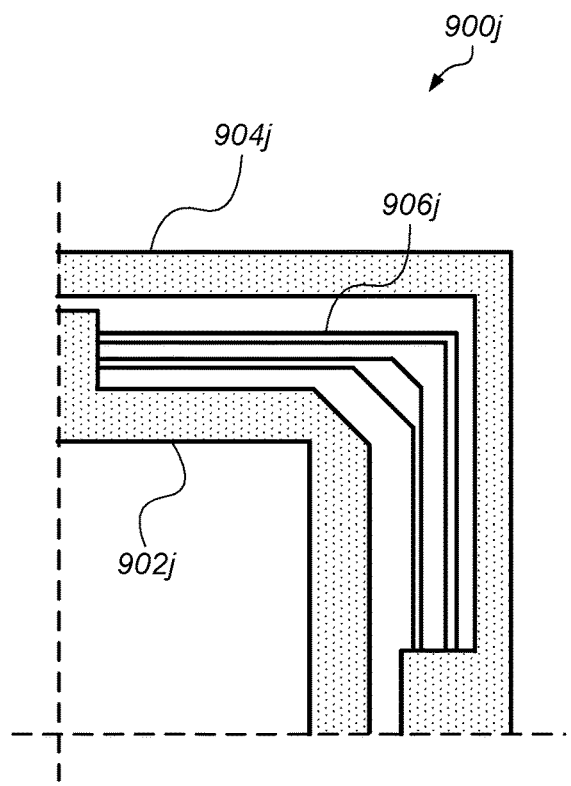

FIG. 9J illustrates a partial top view of a flexure module configuration 900j, in accordance with some embodiments. The flexure module configuration 900j includes a dynamic platform 902j, a static platform 904j, and flexures 906j.

FIG. 9K illustrates a partial top view of a flexure module configuration 900k, in accordance with some embodiments. The flexure module configuration 900k includes a dynamic platform 902k, a static platform 904k, flexures 906k, and flexure stabilizer members 908k.

Figure 9L:
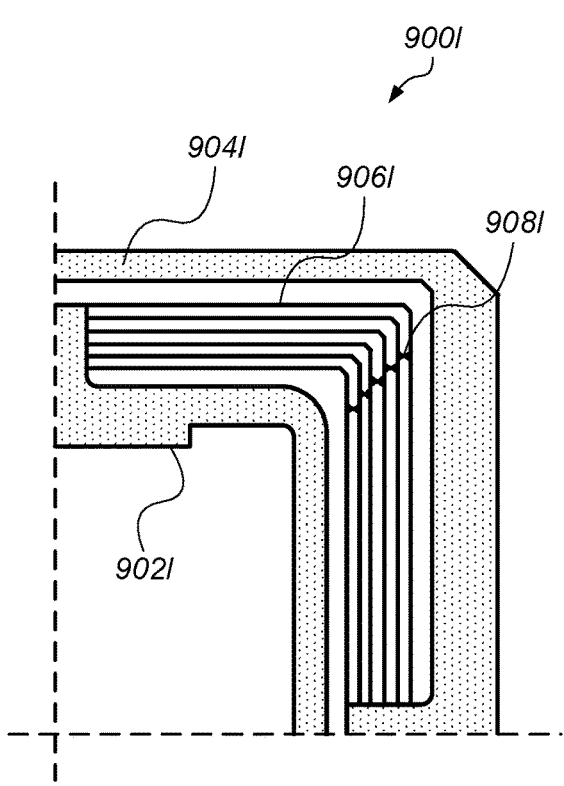

FIG. 9L illustrates a partial top view of a flexure module configuration 900l, in accordance with some embodiments.

The flexure module configuration 900*l* includes a dynamic platform 902*l*, a static platform 904*l*, flexures 906*l*, and flexure stabilizer members 908*l*.

With respect to flexures, some of the example flexure module configurations of FIGS. 9A-9L indicate variations of the flexures that include, but are not limited to, one or more of the following:

(1a) The number of flexures may vary. For instance, a flexure module may include one or multiple flexures. In a particular example, a flexure module may include three to six flexures in a flexure group. As a non-limiting examples, the flexure group shown in FIG. 9A includes five flexures, while the flexure group shown in FIG. 9J includes four flexures. The number of flexures in a flexure group may impact the stiffness of the flexure group. In some instances, a greater number of flexures may correspond to a higher stiffness of the flexure group.

(2a) The flexures may be parallel to each other. For instance, the flexure groups shown in FIGS. 9A-9C, 9E, 9F, 9H, 9I, 9K, and 9L have flexures that are parallel to each other. However, the flexures do not need to be parallel to each other. For examples, the flexure groups shown in FIGS. 9D, 9G, and 9J include flexures that are not parallel to each other.

(3a) The flexures may be parallel to a frame edge (e.g., an edge of a dynamic platform and/or a static platform of a flexure module). For instance, each of FIGS. 9A-9L include portions of one or more flexures that are parallel to the dynamic platform and/or the static platform. In some examples, portions of one or more flexures of a flexure group may not be parallel to the dynamic platform and/or the static platform. For instance, in FIG. 9G, portions of the flexures 906*g* are not parallel to the dynamic platform 902*g* or the static platform 904*g*.

(4a) The flexures may be evenly spaced apart from each other. As a non-limiting example, the flexure groups shown in FIGS. 9A-9C, 9E, 9F, 9H, 9I, 9K, and 9L include flexures that are evenly spaced apart from each other. In other examples, the flexures may not be evenly spaced apart from each other. For instance, the flexure groups shown in FIGS. 9D, 9G, and 9J include flexures that are not evenly spaced apart from each other.

(5a) A width of a flexures may vary along the flexures and/or among the flexures. For instance, the flexure group shown in FIG. 9D includes flexures with such width variations.

(6a) The flexures may include features (e.g., a recess, an extension, an aperture, etc.). For instance, the flexure group shown in FIG. 9D includes an innermost flexure that defines an aperture.

(7a) A cross-section of the flexures may be rectangular, concave, and/or convex in shape, e.g., as discussed below with reference to FIGS. 10A-10J.

(8a) The flexures may be a solid material, clad, or switched beam, e.g., as discussed below with reference to FIGS. 10A-10J.

With respect to bends of the flexures (or flexure groups), some of the example flexure module configurations of FIGS. 9A-9L indicate bend variations that include, but are not limited to, one or more of the following:

(1b) The flexures may include one or more bends. For example, the flexures shown in FIGS. 9A and 9B have three bends, while the flexures shown in FIG. 9C have two bends, and the flexures shown in FIG. 9D have one bend.

(2b) A turning angle of the bends may vary. In some examples, the turning angle may be 90 degrees. For instance, the flexure group shown in FIG. 9A includes bends that have 90 degree turning angles. However, in other examples, the turning angle may be an angle other than 90 degrees. For instance, the innermost flexure shown in FIG. 9G has a bend with a turning angle that is not 90 degrees.

(3b) The turning radii of the bends may vary. For example, the flexure groups shown in FIGS. 9D and 9J include flexures with bends that have varying turning radii.

With respect to flexure stabilizer members, some of the example flexure module configurations of FIGS. 9A-9L indicate variations of the flexure stabilizer members that include, but are not limited to, one or more of the following:

(1c) One or more flexure stabilizer members may connect the flexures. For example, in FIG. 9A, a single flexure stabilizer member connects the flexures at one of the three bends of the flexure group. In FIG. 9B, three flexure stabilizer members are used to connect the flexures, with each flexure connecting the flexures at a respective bend of the flexure group.

(2c) A flexure stabilizer member may connect some or all of the flexures. For instance, in FIG. 9A, a flexure stabilizer member connects all of the flexures of the flexure group. The flexure groups shown in FIGS. 9F and 9L include flexure stabilizer members that connect some, but not all, of the flexures. In some cases, a flexure stabilizer member may be used to connect two adjacent flexures to each other without connecting those flexures to any other flexures.

(3c) The locations of the flexure stabilizer members may be anywhere on the flexures. In some examples, the locations of the flexure stabilizer members may be different among the flexures. For instance, in FIGS. 9F and 9L, the locations of the flexure stabilizer members are different among the flexures. Furthermore, in FIG. 9F, the number of flexure stabilizer members connecting the flexures varies. Some of the flexures are connected via two flexure stabilizer members, while other flexures are connected via three flexure stabilizer members. In some instances, a width and/or a thickness of the flexure stabilizer members may vary, with some being wider and/or thicker than others, e.g., as illustrated in FIG. 9F.

(4c) An angle between the flexure stabilizer members and the flexures may vary. In some examples, the angle between the flexure stabilizer member and the flexures may be 90 degrees, e.g., as shown in FIGS. 9A-9C, 9F, 9I, and 9L. However, in other examples, the angle may be an angle other than 90 degrees, e.g., as shown in FIG. 9K.

With respect to offsets of the dynamic platform and/or the static platform, some of the example flexure module configurations of FIGS. 9A-9L indicate variations of the offsets that include, but are not limited to, one or more of the following:

(1d) An offset may exist at a flexure root where flexures connect to the dynamic platform and/or the static platform, e.g., as shown in FIGS. 9A-9L.

(2d) The offset may be, for example, a recess, an extrusion, etc. For instance, FIGS. 9A, 9B, 9F, and 9K show a recess at the dynamic platform and an extension at the static platform. FIGS. 9C, 9D, 9E, 9G, 9I, 9J, and 9L show an extension at the dynamic platform and an extension at the static platform.

With respect to flexure connecting angles to the dynamic platform and/or the static platform, some of the example flexure module configurations of FIGS. 9A-9L indicate variations of the flexure connecting angles that include, but are not limited to, one or more of the following:

(1e) The flexure connecting angles may vary. In some examples, a flexure connecting angle may be 90 degrees, e.g., as shown in FIGS. 9A-9D, 9F, 9H, and 9J-9L. However, in other examples, the flexure connecting angle may be an angle other than 90 degrees, e.g., as shown in FIGS. 9E, 9G, and 9I.

(2e) Different flexures may have different flexure connecting angles, e.g., as shown in FIG. 9G.

(3e) For dynamic platforms and/or static platforms with an offset, the flexures may be connected to any available edge of the offset. In some cases, the flexures may be connected to an edge of the offset that is parallel to the side of the dynamic platform or the static platform that defines the offset, e.g., as shown in FIGS. 9A-9C, 9F, 9H, and 9K. In some examples, the flexures may be connected to an edge of the offset that is orthogonal to the side of the dynamic platform or the static platform that defines the offset, e.g., as shown in FIGS. 9D, 9J, and 9L. In some cases, the flexures may be connected to a slanted edge of the offset that is at an angle to the side of the dynamic platform or the static platform that defines the offset, e.g., as shown in FIGS. 9E, 9G, and 9I. In some embodiments, the slanted edges may be used to individually adjust the lengths of different flexures.

With respect to flexure patterns (which, in some cases, may include a pattern formed by the flexures and the flexure stabilizer members), some of the example flexure module configurations of FIGS. 9A-9L indicate variations of the flexure patterns that include, but are not limited to, one or more of the following:

(1f) The flexure pattern may be symmetric. For instance, the flexure pattern may be symmetric along at least two axes (e.g., the x and y axes) that are orthogonal to the optical axis. For example, the flexure patterns shown in FIGS. 3, 7A, 8A, and 8B are symmetric along two axes.

(1g) The flexure pattern may be asymmetric. For instance, the flexure pattern may be asymmetric along at least one axis (e.g., the x axis or the y axis) that is orthogonal to the optical axis. For instance, a flexure pattern may include multiple different ones of the flexure module configurations shown in FIGS. 9A-9L such that the flexure pattern is asymmetric along the x axis and/or the y axis.

FIGS. 10A-10J illustrate views of example flexures and/or traces, in accordance with some embodiments. In some cases, one or more embodiments of the example flexures may be used in a flexure module (e.g., the flexure modules described herein with reference to FIGS. 8A-8B and 11A-12B) of a voice coil motor (VCM) actuator. The VCM actuator may be used, for example, in a camera (e.g., the cameras described above with reference to FIGS. 1-5) to provide optical image stabilization.

Figure 10A:
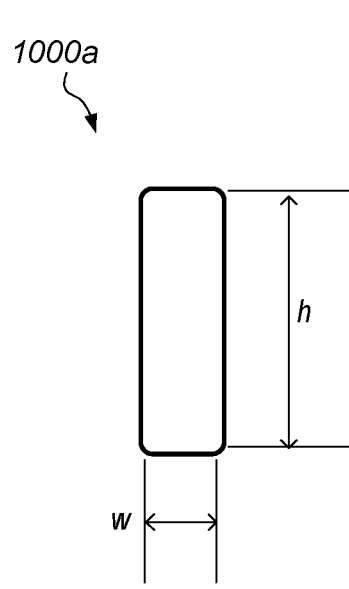
FIGS. 10A-10J illustrate views of a example flexures and/or traces, in accordance with some embodiments. In some cases, one or more embodiments of the example flexures may be used in a flexure module of a voice coil motor (VCM) actuator. The VCM actuator may be used, for example, in a camera to provide optical image stabilization.

FIG. 10A illustrates a cross-sectional view of a flexure 1000a, in accordance with some embodiments. For instance, the cross-sectional view of the flexure 1000a may be taken along a plane that is parallel to the optical axis. The flexure 1000a may have a width dimension (denoted as "w" in FIG. 10A) and a height dimension (denoted as "h" in FIG. 10A). In some examples, the height dimension may be greater than the width dimension. For instance, in a particular embodiment, the height dimension may be about 120 micrometers and the width dimension may be about 30 micrometers. It should be understood that the height dimension and/or the width dimension may be any other suitable dimension.

Figure 10C:
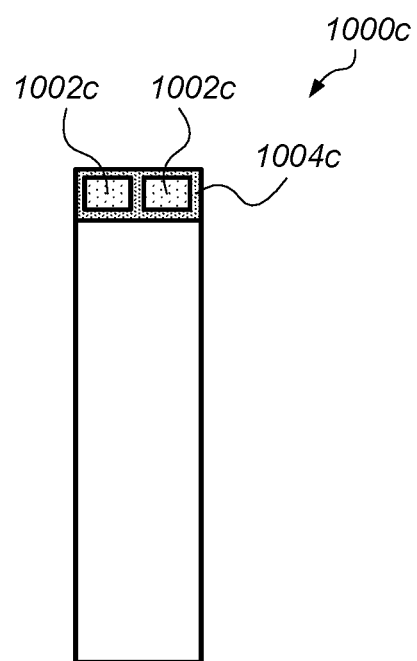
Figure 10B:
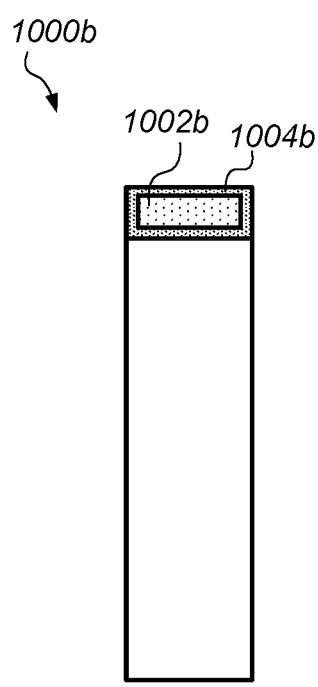

FIG. 10B illustrates a cross-sectional view of a flexure 1000b, in accordance with some embodiments. The flexure 1000b may include an electrical trace 1002b. The electrical trace 1002b may be configured to convey signals (e.g., image signals) from a dynamic platform to a static platform. The electrical trace 1002b may be routed along at least a portion of the flexure 1000b. In some examples, the electrical trace 1002b may be located at a top portion of the flexure 1000b. In other examples, however, the electrical trace 1002b may additionally or alternatively be located at a middle and/or bottom portion of the flexure 1000b. In some cases, the electrical trace 1002b may be a conductive material. For instance, the electrical trace 1002b may be a copper deposition on the flexure 1000b. In some embodiments, the electrical trace 1002b may be electrically insulated. For instance, the electrical trace 1002b may be at least partially coated by a dielectric material 1004b (e.g., a polyimide).

FIG. 10C illustrates a cross-sectional view of a flexure 1000c, in accordance with some embodiments. The flexure 1000c may include multiple electrical traces 1002c (e.g., the electrical trace 1002b described above with reference to FIG. 10B). The electrical traces 1002c may be oriented side-by-side horizontally such that a horizontal plane passes through the electrical traces 1002c. The electrical traces 1002c may be routed along at least a portion of the flexure 1000c. In some examples, the electrical traces 1002c may be located at a top portion of the flexure 1000c. In other examples, however, the electrical traces 1002c may additionally or alternatively be located at a middle and/or bottom portion of the flexure 1000c. In some embodiments, the electrical traces 1002c may be electrically insulated from the rest of the flexure 1000c and/or from each other. For instance, the electrical traces 1002c may each be at least partially coated by a dielectric material 1004c (e.g., a polyimide).

Figure 10D:
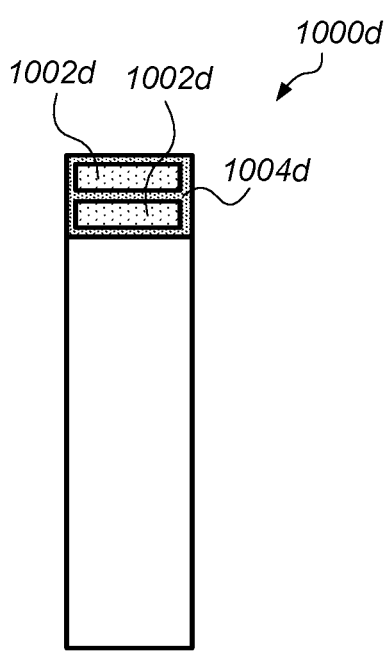

FIG. 10D illustrates a cross-sectional view of a flexure 1000d, in accordance with some embodiments. The flexure 1000d may include multiple electrical traces 1002d (e.g., the electrical trace 1002b described above with reference to FIG. 10B). The electrical traces 1002d may be oriented side-by-side vertically such that a vertical plane passes through the electrical traces 1002d. The electrical traces 1002d may be routed along at least a portion of the flexure 1000d. In some examples, the electrical traces 1002d may be located at a top portion of the flexure 1000d. In other examples, however, the electrical traces 1002d may additionally or alternatively be located at a middle and/or bottom portion of the flexure 1000d. In some embodiments, the electrical traces 1002d may be electrically insulated from the rest of the flexure 1000d and/or from each other. For instance, the electrical traces 1002d may each be at least partially coated by a dielectric material 1004d (e.g., a polyimide).

Figure 10E:
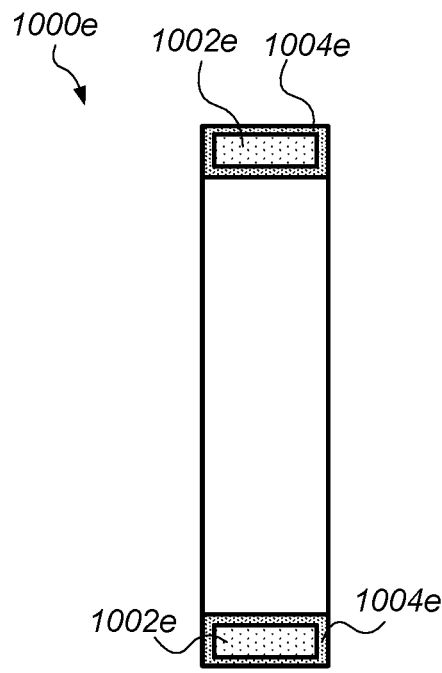

FIG. 10E illustrates a cross-sectional view of a flexure 1000e, in accordance with some embodiments. The flexure 1000e may include multiple electrical traces 1002e (e.g., the electrical trace 1002b described above with reference to FIG. 10B). The electrical traces 1002e may be routed from a dynamic platform to a static platform along at least a portion of the flexure 1000e. In some cases, one or more of the electrical traces 1002e may be located at a top portion of the flexure 1000e, and one or more of the electrical traces 1002e may be located at a top portion of the flexure 1000e. In some embodiments, the electrical traces 1002d may be electrically insulated from the rest of the flexure 1000e and/or from each other. For instance, the electrical traces 1002d may each be at least partially coated by a dielectric material 1004e (e.g., a polyimide).

Figure 10G:
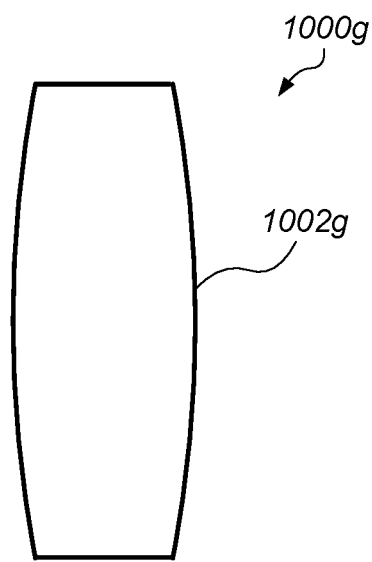
Figure 10F:
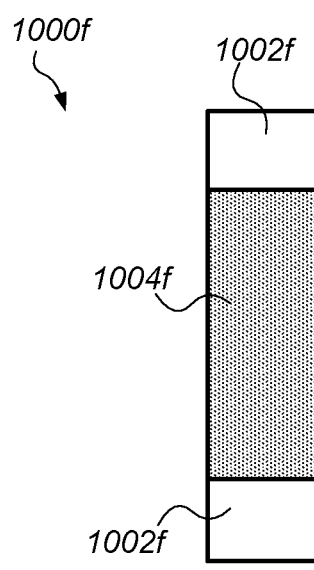

FIG. 10F illustrates a cross-sectional view of a flexure 1000f, in accordance with some embodiments. The flexure 1000f may be formed of multiple materials. For instance, the flexure 1000f may include a first material 1002f that sandwiches a second material 1004f. In some examples, the first material 1002f and/or the second material 1004f may include or be one or more electrical traces (e.g., the electrical trace 1002b described above with reference to FIG. 10B).

FIG. 10G illustrates a cross-sectional view of a flexure 1000g, in accordance with some embodiments. The flexure 1000g may include a concave portion 1002g.

Figure 10H:
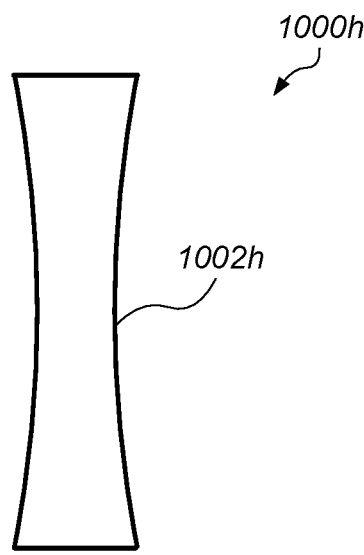

FIG. 10H illustrates a cross-sectional view of a flexure 1000h, in accordance with some embodiments. The flexure 1000h may include a convex portion 1002h.

Figure 10I:
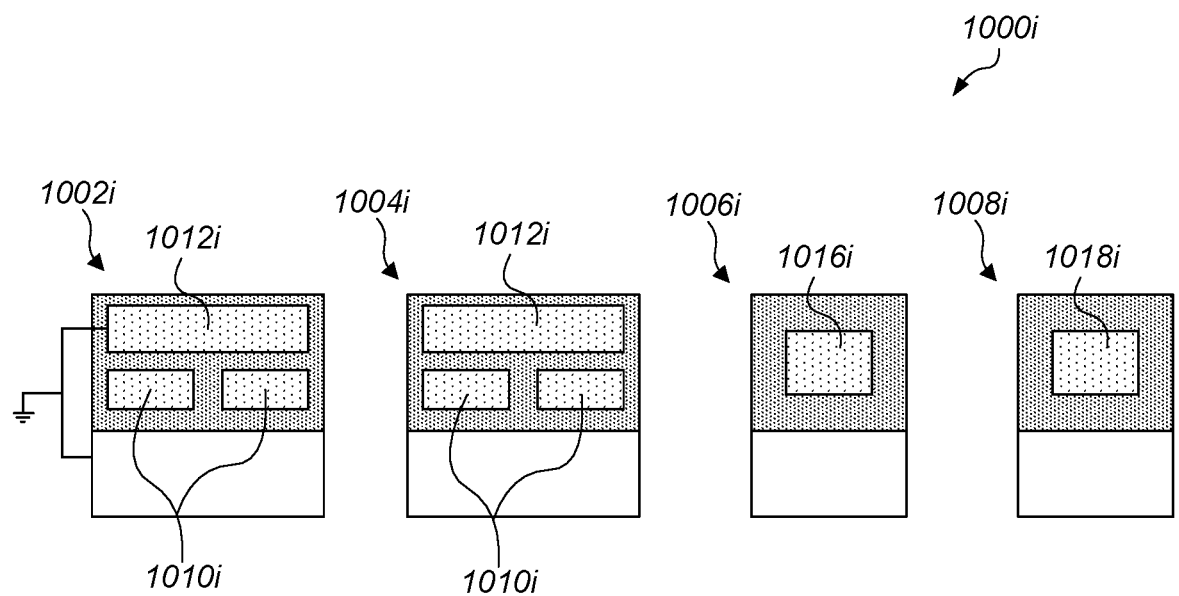

FIG. 10I illustrates a cross-sectional view of a flexure configuration 1000i, in accordance with some embodiments. In some embodiments, the flexure configuration 1000i may include a first flexure 1002i, a second flexure 1004i, a third flexure 1006i, and/or a fourth flexure 1008i.

In some embodiments, an OIS frame may be formed from a conductive material (e.g., a copper alloy, stainless steel, or the like), such that the flexures themselves may act as a ground path between the static platform and the dynamic platform. Additionally, grounding traces may be added to shield high-frequency lines (e.g., dual pair lines that carry image signals from an image sensor to an image signal processor). For example, each of the first flexure 1002i and the second flexure 1004 may include signal traces 1010i (e.g., two signal traces, as shown in FIG. 10I). Furthermore, one or more common shield traces 1012i may overly the signal traces 1010i to shield the signal traces 1010i. The signal traces 1010i and/or the common shield trace 1012i may be electrically insulated from each other, from the rest of the respective flexure, and/or from other flexures, via an insulator 1014i. In some cases, a portion having the signal traces 1010i, the common shield trace 1012i, and the insulator 1014i may be wider than the underlying portion of the respective flexure, such that at least a portion of the insulator 1014i and/or one or more of the traces 1012i, 1014i extends beyond the width of the underlying portion of the respective flexure.

In some examples, it may be desirable to selectively choose which traces are placed on different flexures. For example, in instances where one trace and a flexure carries a power signal to the dynamic platform (e.g., to the image sensor and/or OIS control circuitry) and traces on another flexure carry image signals from the image sensor, it may be desirable to position a ground trace on a flexure between the power-carrying flexure and the signal-carrying flexure. For instance, the third flexure 1006i may include a ground trace 1016i, and the fourth flexure 1008i may include a power trace 1018i. The third flexure 1006i (which includes the ground trace 1016i) may be positioned between the second flexure 1004i (which may carry image signals via the signal traces 1010i) and the fourth flexure 1008i (which may carry power via the power trace 1008i). In some cases, the ground trace 1016i may be a reference different from the grounding of the OIS frame itself. Additionally, in some instances it may be desirable to route one or more power traces along the shortest flexure on the OIS frame. Similarly, image-carrying traces may also be prioritized for shorter flexures, while other traces (e.g., carrying information between the OIS frame and the axial motion (autofocus) voice coil motor (VCM) actuator) may have longer trace lengths.

Figure 10J:
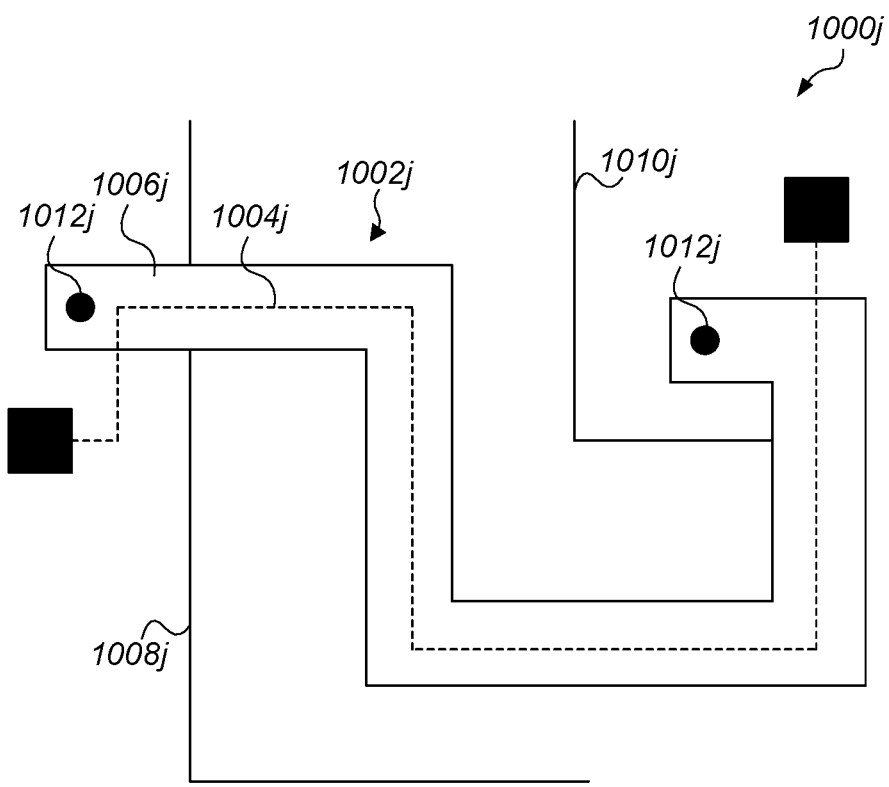

FIG. 10J illustrates a top view of a flexure configuration 1000j, in accordance with some embodiments. The flexure configuration 1000j may include a flexure 1002j that routes a signal trace 1004j and a shield trace 1006j from a dynamic platform 1008j to a static platform 1010j. The signal trace 1004j and/or the shield trace 1006j may be electrically connected to the OIS frame at one or more points along the dynamic platform 1008j, the static platform 1010j, and/or the flexure 1002j. As illustrated in FIG. 10J, in some embodiments the signal trace 1004j and the shield trace 1006 may follow different paths on the dynamic platform 1008j and the static platform 1010j to allow the shield trace 1006 to electrically connect to the dynamic platform 1008j and the static platform 1010j, e.g., using vias 1012j.

In various embodiments, one or more of the flexure stabilizer members described herein (e.g., with reference to FIGS. 8A-9L and 11A-12B) may have cross-sections that are similar to, or identical to, one or more of the flexures described herein (e.g., with reference to FIGS. 10A-10J).

Figure 11A:
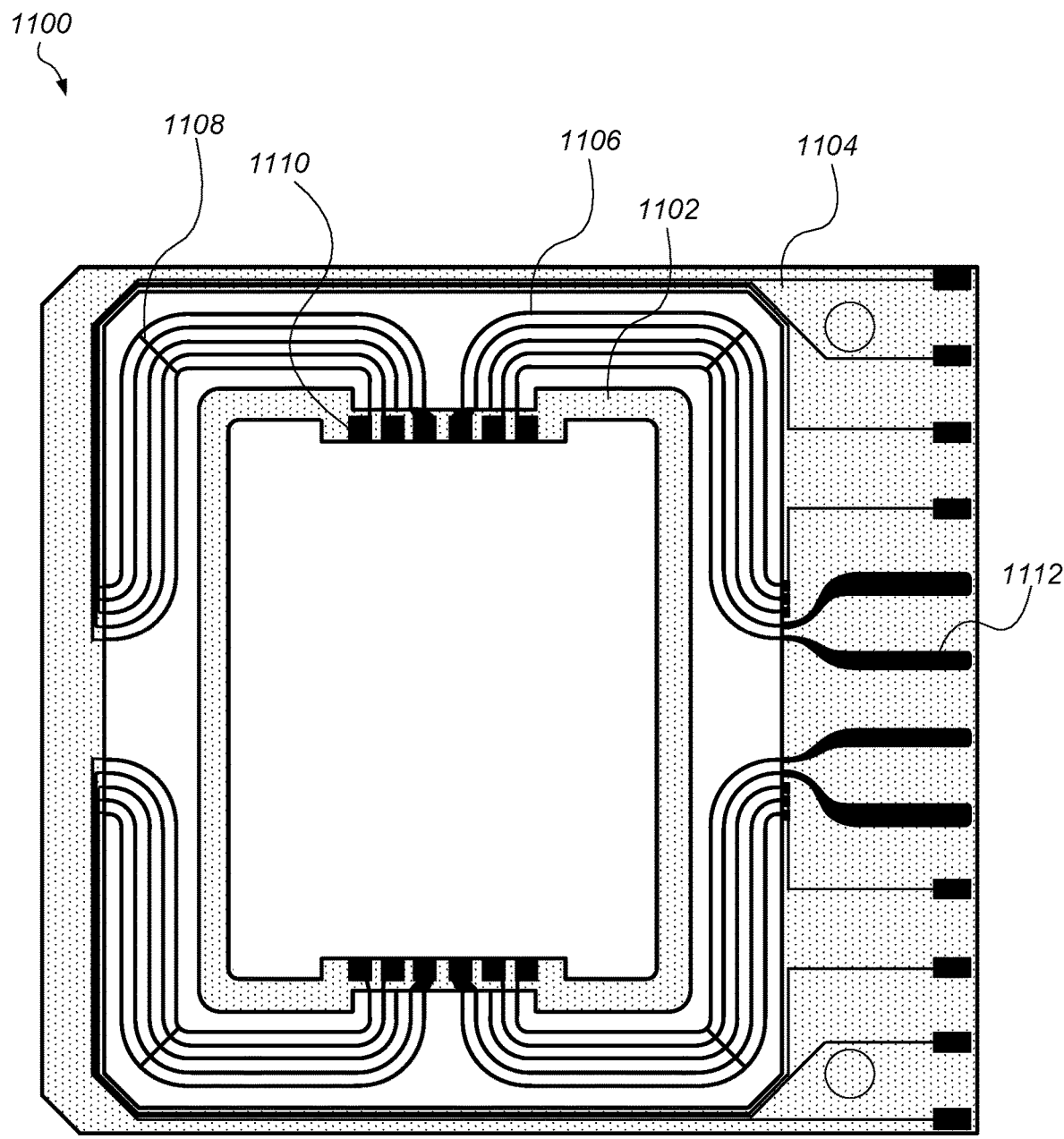
FIGS. 11A-11B each illustrate a view of an example flexure module of a voice coil motor (VCM) actuator that may be used, for example, in a camera to provide optical image stabilization, in accordance with some embodiments.
Figure 11B:
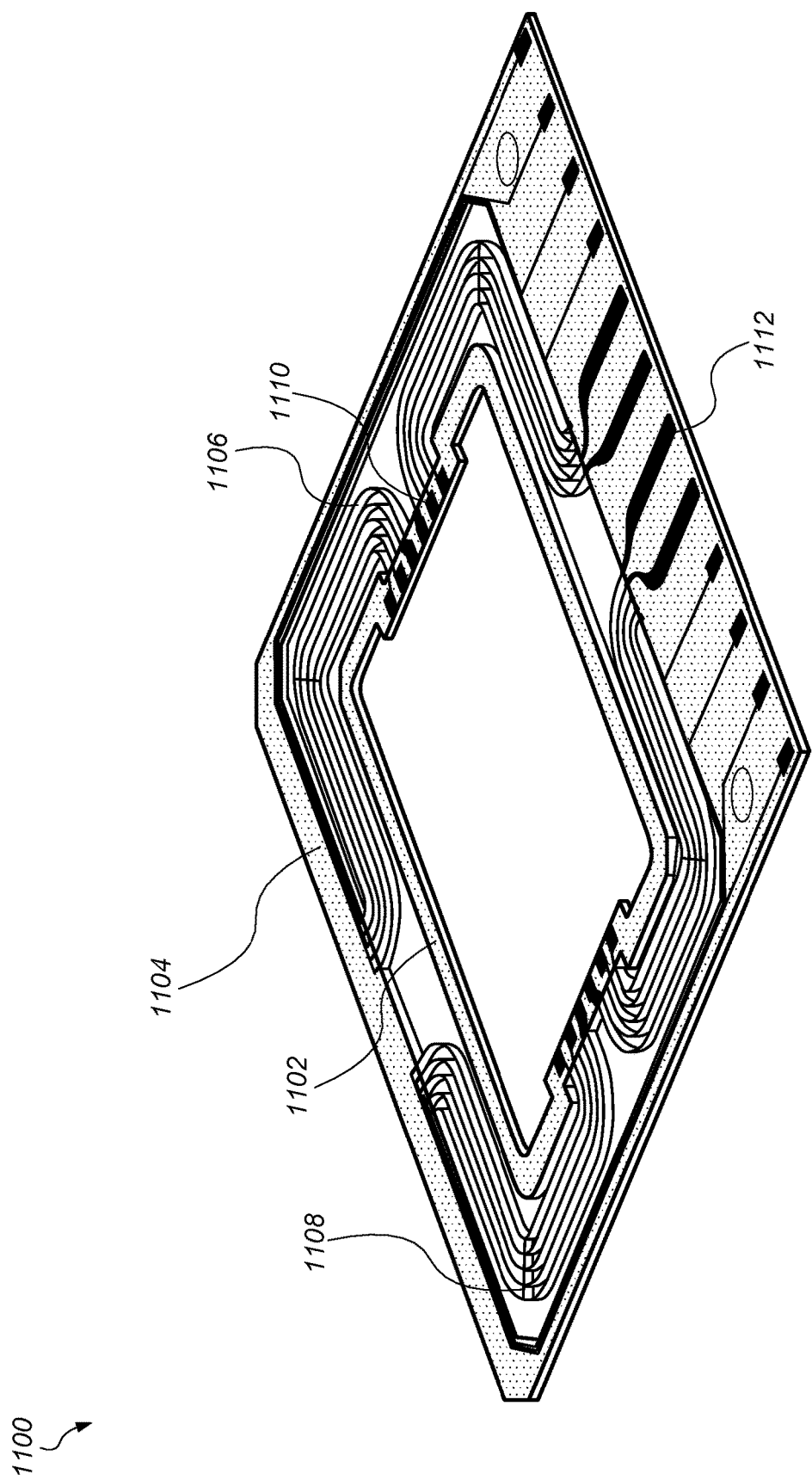

FIGS. 11A-11B each illustrate a view of an example flexure module 1100 of a voice coil motor (VCM) actuator that may be used, for example, in a camera (e.g., the cameras described above with reference to FIGS. 1-5) to provide optical image stabilization, in accordance with some embodiments. FIG. 11A illustrates a top view of the flexure module 1100. FIG. 11B illustrates a perspective view of the flexure module 1100. Electrical traces may be routed from a dynamic platform 1102 to a static platform 1104 via flexures 1106 and/or flexure stabilizer members 1108, e.g., as described above with reference to FIGS. 10A-10J. In some examples, the electrical traces may be routed, via one or more flexures 1106 and/or one or more flexure stabilizer members 1108, from one or more electrical connection elements 1110 disposed on the dynamic platform 1102 to one or more electrical connection elements 1112 disposed on the static platform 1112.

The electrical connection elements 1110 may be disposed along one or more portions (or sides), of the dynamic platform 1102. For instance, the electrical connection elements 1110 may be disposed along one or more flexure roots at which the flexures 1106 connect to the dynamic platform 1102. Likewise, the electrical connection elements 1112 may be disposed along one or more portions (or sides) of the static platform 1104. For instance, the electrical connection elements 1112 may be disposed along one or more flexure roots at which the flexures 1106 connect to the static platform 1104. In some examples, the electrical connection elements 1110 may be configured to electrically couple with an image sensor and/or another component (e.g., a flip chip, a substrate, etc.) that is coupled to the image sensor. Accordingly, the dynamic platform 1102 may be configured to receive signals (e.g., image signals) from the image sensor via the electrical connection elements 1110, and the signals may be conveyed from the electrical connection elements 1110 of the dynamic platform 1102 to the electrical connection elements 1112 of the static platform 1104 via one or more electrical traces routed along the flexures 1106 and/or the flexure stabilizer members 1108.

In FIGS. 11A and 11B, the electrical connection elements 1112 are located on a common side of the static platform 1104. However, electrical connection elements may be on multiple sides of the static platform in some embodiments. For example, FIG. 7A shows electrical connection elements on two different sides of the static platform.

In some embodiments, when there are electrical traces on both sides of a flexure 1106 (e.g., as indicated in FIG. 10E), there may be vias through the dynamic platform 1102 so that electrical connection elements 1110 are on a common side of the dynamic platform 1102. For the static platform, electrical traces may be brought up to a common surface using vias (e.g., to facilitate ease of connection) or may be on different surfaces (which can facilitate reduction in the size of the OIS frame in some cases).

Figure 12A:
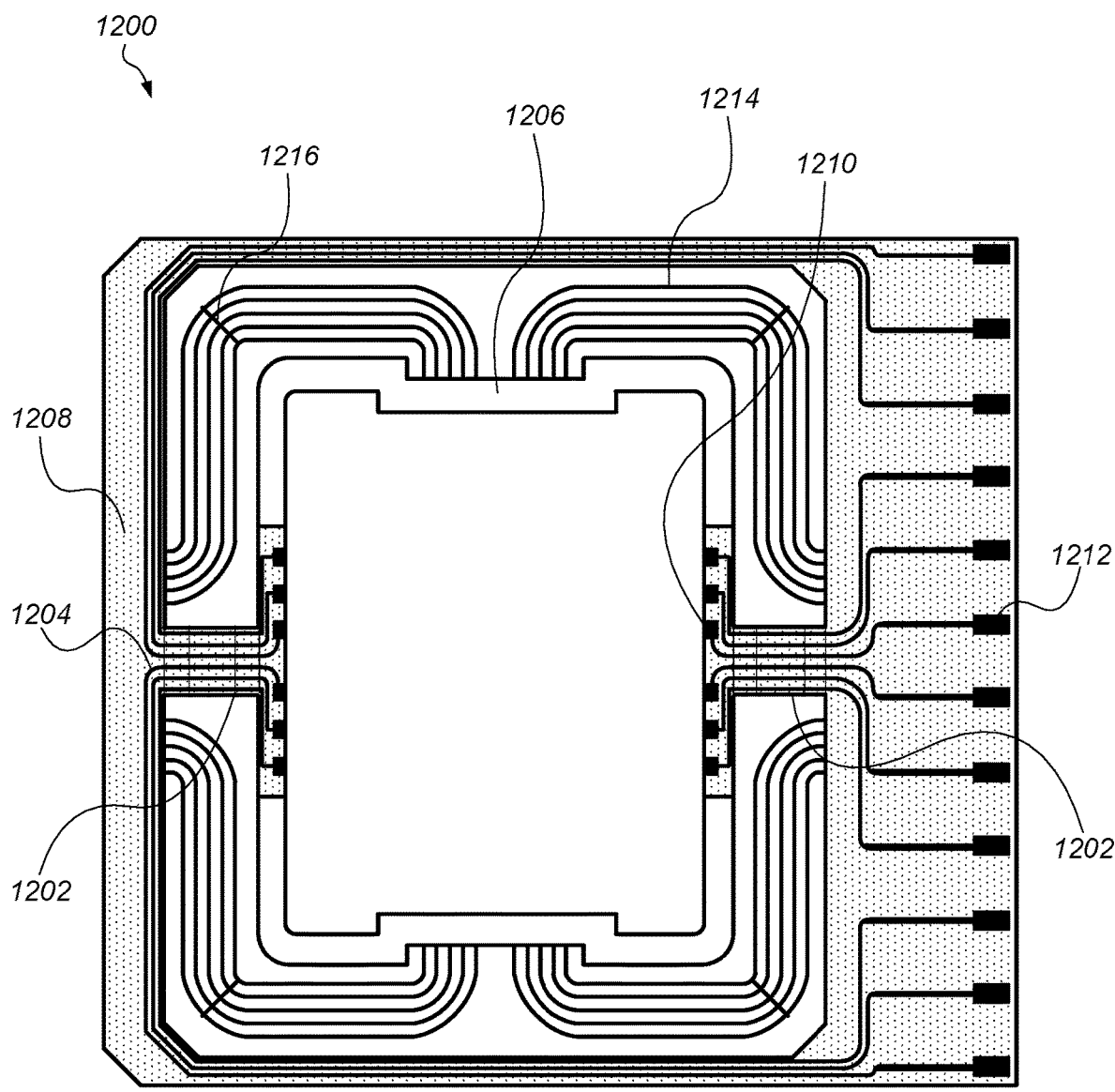
FIGS. 12A-12B each illustrate a view of an example flexure module of a voice coil motor (VCM) actuator that may be used, for example, in a camera to provide optical image stabilization, in accordance with some embodiments.
Figure 12B:
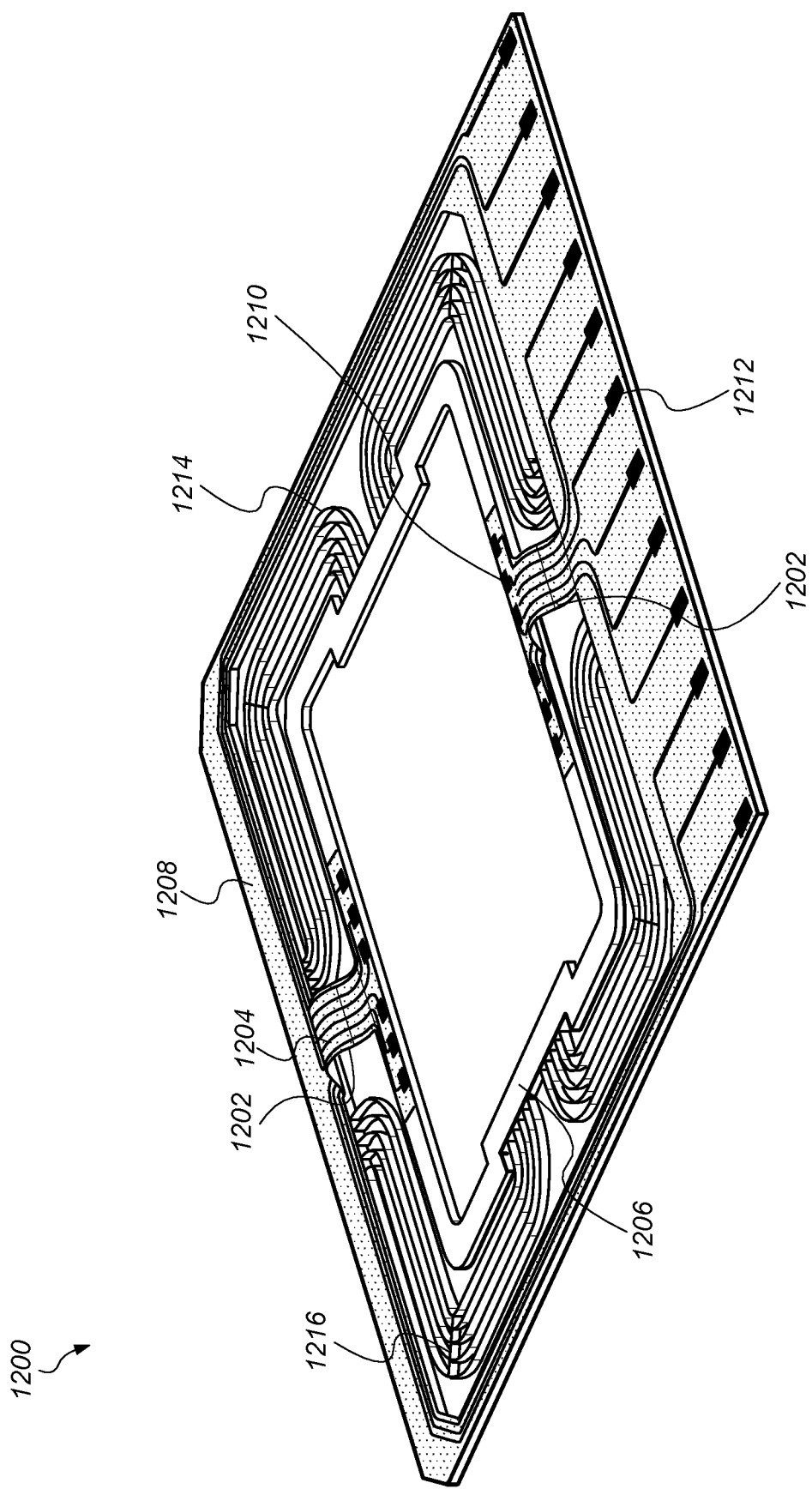

FIGS. 12A-12B each illustrate a view of a flexure module 1200 of a voice coil motor (VCM) actuator that may be used, for example, in a camera e.g., the cameras described above with reference to FIGS. 1-5) to provide optical image stabilization, in accordance with some embodiments. FIG. 12A illustrates a top view of the flexure module 1200. FIG. 12B illustrates a perspective view of the flexure module 1200. The flexure module 1200 may include one or more flex circuits 1202 configured to route one or more electrical traces 1204 from a dynamic platform 1206 to a static platform 1208.

In some examples, the electrical traces 1204 may be routed, via one or more flex circuits 1202, from one or more electrical connection elements 1210 disposed on the dynamic platform 1206 to one or more electrical connection elements 1212 disposed on the static platform 1208.

The electrical connection elements 1210 may be disposed along one or more portions (or sides), of the dynamic platform 1206. Likewise, the electrical connection elements 1212 may be disposed along one or more portions (or sides) of the static platform 1208. In some examples, the electrical connection elements 1210 may be configured to electrically couple with an image sensor and/or another component (e.g., a flip chip, a substrate, etc.) that is coupled to the image sensor. Accordingly, the dynamic platform 1206 may be configured to receive signals (e.g., image signals) from the image sensor via the electrical connection elements 1210, and the signals may be conveyed from the electrical connection elements 1210 of the dynamic platform 1206 to the electrical connection elements 1212 of the static platform 1208 via one or more electrical traces 1204 routed along one or more flex circuits 1202.

In some embodiments, a flex circuit 1202 may include a first end that is fixed (e.g., via an adhesive) to the dynamic platform 1206, a second end that is fixed (e.g., via an adhesive) to the static platform 1208, and a middle portion between the first end and the second end. The second end of the flex circuit 1202 may be opposite the first end of the flex circuit 1202. Furthermore, in some embodiments, the middle portion of the flex circuit 1202 may include an amount of slack that facilitates relative movement between the first and second ends of the flex circuit 1202. The amount of slack may be determined based at least in part on a stiffness of the flexure module 1200. Moreover, in various embodiments, the flex circuits 1202 may include a flexible material. In some embodiments, multiple flex circuits 1202 may be disposed in proximity with one another to form a flex circuit array.

In some examples, in addition to routing electrical traces via one or more flex circuits 1204, the flexure module 1200 may route electrical traces via the flexures 1214 and/or the flexure stabilizer members 1216, e.g., as described above with reference to FIGS. 11A-11B.

Figure 13:
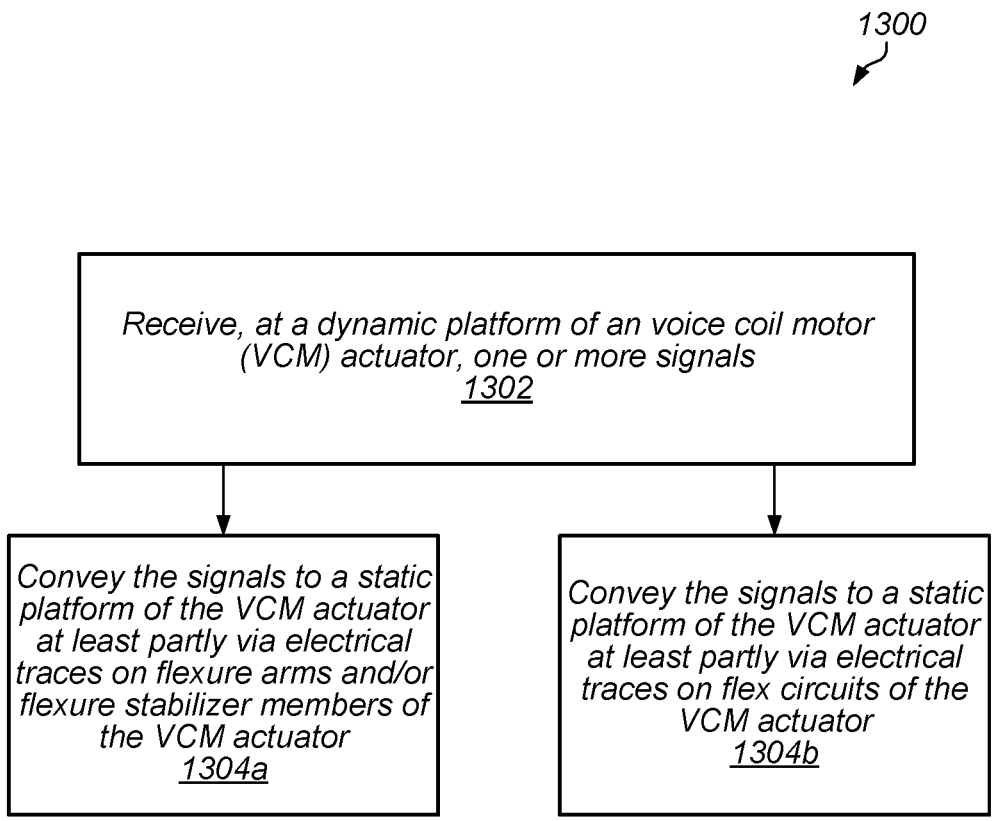
FIG. 13 is a flowchart of an example method of conveying signals from a dynamic platform of a voice coil motor (VCM) actuator to a static platform of a VCM actuator, in accordance with some embodiments.

FIG. 13 is a flowchart of an example method 1300 of conveying signals (e.g., image signals) from a dynamic platform of a voice coil motor (VCM) actuator to a static platform of a VCM actuator, in accordance with some embodiments. At 1302, the method 1300 may include receiving, at the dynamic platform, one or more signals. For instance, the signals may be signals produced by an image sensor. At 1304a, the method 1300 may include conveying the signals from the dynamic platform to the static platform at least partly via electrical traces routed on/within one or more flexure arms and/or one or more flexure stabilizer members of the VCM actuator, e.g., as described above with reference to FIGS. 11A-11B. Additionally, or alternatively, at 1304b, the method 1300 may include conveying the signals from the dynamic platform to the static platform at least partly via electrical traces routed on/within one or more flex circuits of the VCM actuator, e.g., as described above with reference to FIGS. 12A-12B.

Multifunction Device Examples

Embodiments of electronic devices, user interfaces for such devices, and associated processes for using such devices are described. In some embodiments, the device is a portable communications device, such as a mobile telephone, that also contains other functions, such as PDA and/or music player functions. Other portable electronic devices, such as laptops, cameras, cell phones, or tablet computers, may also be used. It should also be understood that, in some embodiments, the device is not a portable communications device, but is a desktop computer with a camera. In some embodiments, the device is a gaming computer with orientation sensors (e.g., orientation sensors in a gaming controller). In other embodiments, the device is not a portable communications device, but is a camera.

In the discussion that follows, an electronic device that includes a display and a touch-sensitive surface is described. It should be understood, however, that the electronic device may include one or more other physical user-interface devices, such as a physical keyboard, a mouse and/or a joystick.

The device typically supports a variety of applications, such as one or more of the following: a drawing application, a presentation application, a word processing application, a website creation application, a disk authoring application, a spreadsheet application, a gaming application, a telephone application, a video conferencing application, an e-mail application, an instant messaging application, a workout support application, a photo management application, a digital camera application, a digital video camera application, a web browsing application, a digital music player application, and/or a digital video player application.

The various applications that may be executed on the device may use at least one common physical user-interface device, such as the touch-sensitive surface. One or more functions of the touch-sensitive surface as well as corresponding information displayed on the device may be adjusted and/or varied from one application to the next and/or within a respective application. In this way, a common physical architecture (such as the touch-sensitive surface) of the device may support the variety of applications with user interfaces that are intuitive and transparent to the user.

Figure 14:
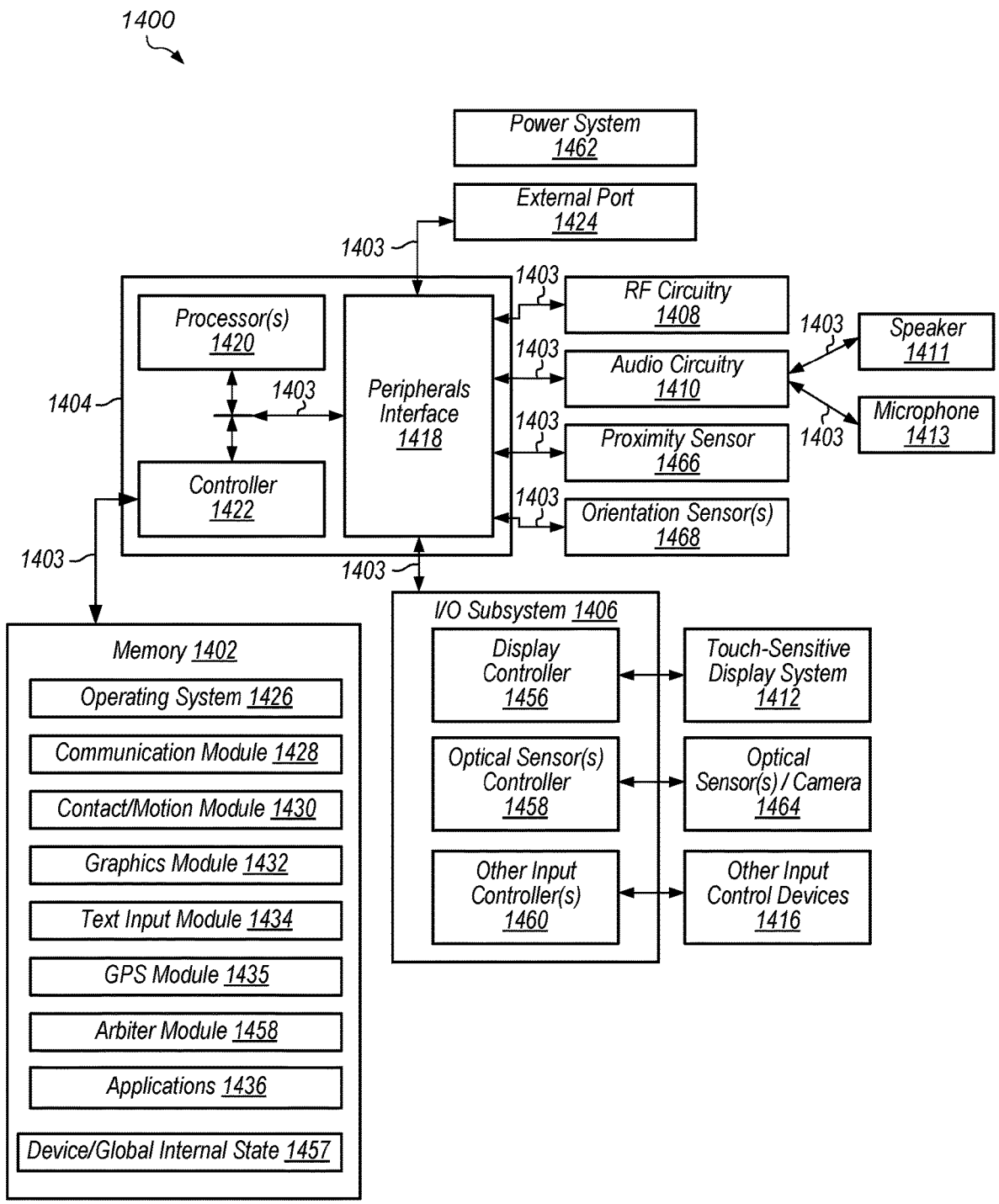
FIG. 14 illustrates a block diagram of a portable multifunction device with a camera, in accordance with some embodiments.

Attention is now directed toward embodiments of portable devices with cameras. FIG. 14 illustrates a block diagram of an example portable multifunction device that may include a camera module (e.g., the cameras described above with reference to FIG. 1-5), in accordance with some embodiments. Camera 1464 is sometimes called an "optical sensor" for convenience, and may also be known as or called an optical sensor system. Device 1400 may include memory 1402 (which may include one or more computer readable storage mediums), memory controller 1422, one or more processing units (CPUs) 1420, peripherals interface 1418, RF circuitry 1408, audio circuitry 1410, speaker 1411, touch-sensitive display system 1412, microphone 1413, input/output (I/O) subsystem 1406, other input or control devices 1416, and external port 1424. Device 1400 may include one or more optical sensors 1464. These components may communicate over one or more communication buses or signal lines 1403.

It should be appreciated that device 1400 is only one example of a portable multifunction device, and that device 1400 may have more or fewer components than shown, may combine two or more components, or may have a different configuration or arrangement of the components. The various components shown in FIG. 14 may be implemented in hardware, software, or a combination of hardware and software, including one or more signal processing and/or application specific integrated circuits.

Memory 1402 may include high-speed random access memory and may also include non-volatile memory, such as one or more magnetic disk storage devices, flash memory devices, or other non-volatile solid-state memory devices. Access to memory 1402 by other components of device 1400, such as CPU 1420 and the peripherals interface 1418, may be controlled by memory controller 1422.

Peripherals interface 1418 can be used to couple input and output peripherals of the device to CPU 1420 and memory 1402. The one or more processors 1420 run or execute various software programs and/or sets of instructions stored in memory 1402 to perform various functions for device 1400 and to process data.

In some embodiments, peripherals interface 1418, CPU 1420, and memory controller 1422 may be implemented on a single chip, such as chip 1404. In some other embodiments, they may be implemented on separate chips.

RF (radio frequency) circuitry 1408 receives and sends RF signals, also called electromagnetic signals. RF circuitry 1408 converts electrical signals to/from electromagnetic signals and communicates with communications networks and other communications devices via the electromagnetic signals. RF circuitry 1408 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 1408 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a variety of communications standards, protocols and technologies, including but not limited to Global System for Mobile Communications (GSM), Enhanced Data GSM Environment (EDGE), high-speed downlink packet access (HSDPA), high-speed uplink packet access (HSUPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Audio circuitry 1410, speaker 1411, and microphone 1413 provide an audio interface between a user and device 1400. Audio circuitry 1410 receives audio data from peripherals interface 1418, converts the audio data to an electrical signal, and transmits the electrical signal to speaker 1411. Speaker 1411 converts the electrical signal to human-audible sound waves. Audio circuitry 1410 also receives electrical signals converted by microphone 1413 from sound waves. Audio circuitry 1410 converts the electrical signal to audio data and transmits the audio data to peripherals interface 1418 for processing. Audio data may be retrieved from and/or transmitted to memory 1402 and/or RF circuitry 1408 by peripherals interface 1418. In some embodiments, audio circuitry 1410 also includes a headset jack (e.g., 1512, FIG. 15). The headset jack provides an interface between audio circuitry 1410 and removable audio input/output peripherals, such as output-only headphones or a headset with both output (e.g., a headphone for one or both ears) and input (e.g., a microphone).

I/O subsystem 1406 couples input/output peripherals on device 1400, such as touch screen 1412 and other input control devices 1416, to peripherals interface 1418. I/O subsystem 1406 may include display controller 1456 and one or more input controllers 1460 for other input or control devices. The one or more input controllers 1460 receive/send electrical signals from/to other input or control devices 1416. The other input control devices 1416 may include physical buttons (e.g., push buttons, rocker buttons, etc.), dials, slider switches, joysticks, click wheels, and so forth. In some alternate embodiments, input controller(s) 1460 may be coupled to any (or none) of the following: a keyboard, infrared port, USB port, and a pointer device such as a mouse. The one or more buttons (e.g., 1508, FIG. 15) may include an up/down button for volume control of speaker 1411 and/or microphone 1413. The one or more buttons may include a push button (e.g., 1506, FIG. 15).

Touch-sensitive display 1412 provides an input interface and an output interface between the device and a user. Display controller 1456 receives and/or sends electrical signals from/to touch screen 1412. Touch screen 1412 displays visual output to the user. The visual output may include graphics, text, icons, video, and any combination thereof (collectively termed "graphics"). In some embodiments, some or all of the visual output may correspond to user-interface objects.

Touch screen 1412 has a touch-sensitive surface, sensor or set of sensors that accepts input from the user based on haptic and/or tactile contact. Touch screen 1412 and display controller 1456 (along with any associated modules and/or sets of instructions in memory 1402) detect contact (and any movement or breaking of the contact) on touch screen 1412 and converts the detected contact into interaction with user-interface objects (e.g., one or more soft keys, icons, web pages or images) that are displayed on touch screen 1412. In an example embodiment, a point of contact between touch screen 1412 and the user corresponds to a finger of the user.

Touch screen 1412 may use LCD (liquid crystal display) technology, LPD (light emitting polymer display) technology, or LED (light emitting diode) technology, although other display technologies may be used in other embodiments. Touch screen 1412 and display controller 1456 may detect contact and any movement or breaking thereof using any of a variety of touch sensing technologies now known or later developed, including but not limited to capacitive, resistive, infrared, and surface acoustic wave technologies, as well as other proximity sensor arrays or other elements for determining one or more points of contact with touch screen 1412. In an example embodiment, projected mutual capacitance sensing technology is used.

Touch screen 1412 may have a video resolution in excess of 800 dpi. In some embodiments, the touch screen has a video resolution of approximately 860 dpi. The user may make contact with touch screen 1412 using any suitable object or appendage, such as a stylus, a finger, and so forth. In some embodiments, the user interface is designed to work primarily with finger-based contacts and gestures, which can be less precise than stylus-based input due to the larger area of contact of a finger on the touch screen. In some embodiments, the device translates the rough finger-based input into a precise pointer/cursor position or command for performing the actions desired by the user.

In some embodiments, in addition to the touch screen, device 1400 may include a touchpad (not shown) for activating or deactivating particular functions. In some embodiments, the touchpad is a touch-sensitive area of the device that, unlike the touch screen, does not display visual output. The touchpad may be a touch-sensitive surface that is separate from touch screen 1412 or an extension of the touch-sensitive surface formed by the touch screen.

Device 1400 also includes power system 1462 for powering the various components. Power system 1462 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

Device 1400 may also include one or more optical sensors or cameras 1464. FIG. 14 shows an optical sensor 1464 coupled to optical sensor controller 1458 in I/O subsystem 1406. Optical sensor 1464 may include charge-coupled device (CCD) or complementary metal-oxide semiconductor (CMOS) phototransistors. Optical sensor 1464 receives light from the environment, projected through one or more lens, and converts the light to data representing an image. In conjunction with imaging module 1443 (also called a camera module), optical sensor 1464 may capture still images or video. In some embodiments, an optical sensor 1464 is located on the back of device 1400, opposite touch screen display 1412 on the front of the device, so that the touch screen display 1412 may be used as a viewfinder for still and/or video image acquisition. In some embodiments, another optical sensor is located on the front of the device so that the user's image may be obtained for videoconferencing while the user views the other video conference participants on the touch screen display.

Device 1400 may also include one or more proximity sensors 1466. FIG. 14 shows proximity sensor 1466 coupled to peripherals interface 1418. Alternately, proximity sensor 1466 may be coupled to input controller 1460 in I/O subsystem 1406. In some embodiments, the proximity sensor 1466 turns off and disables touch screen 1412 when the multifunction device 1400 is placed near the user's ear (e.g., when the user is making a phone call).

Device 1400 includes one or more orientation sensors 1468. In some embodiments, the one or more orientation sensors 1468 include one or more accelerometers (e.g., one or more linear accelerometers and/or one or more rotational accelerometers). In some embodiments, the one or more orientation sensors 1468 include one or more gyroscopes. In some embodiments, the one or more orientation sensors 1468 include one or more magnetometers. In some embodiments, the one or more orientation sensors 1468 include one or more of global positioning system (GPS), Global Navigation Satellite System (GLONASS), and/or other global navigation system receivers. The GPS, GLONASS, and/or other global navigation system receivers may be used for obtaining information concerning the location and orientation (e.g., portrait or landscape) of device 1400. In some embodiments, the one or more orientation sensors 1468 include any combination of orientation/rotation sensors.

FIG. 14 shows the one or more orientation sensors 1468 coupled to peripherals interface 1418. Alternately, the one or more orientation sensors 1468 may be coupled to an input controller 1460 in I/O subsystem 1406. In some embodiments, information is displayed on the touch screen display 1412 in a portrait view or a landscape view based on an analysis of data received from the one or more orientation sensors 1468.

In some embodiments, the software components stored in memory 1402 include operating system 1426, communication module (or set of instructions) 1428, contact/motion module (or set of instructions) 1430, graphics module (or set of instructions) 1432, text input module (or set of instructions) 1434, Global Positioning System (GPS) module (or set of instructions) 1435, arbiter module 1458 and applications (or sets of instructions) 1436.

Furthermore, in some embodiments memory 1402 stores device/global internal state 1457. Device/global internal state 1457 includes one or more of: active application state, indicating which applications, if any, are currently active; display state, indicating what applications, views or other information occupy various regions of touch screen display 1412; sensor state, including information obtained from the device's various sensors and input control devices 1416; and location information concerning the device's location and/or attitude.

Operating system 1426 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 1428 facilitates communication with other devices over one or more external ports 1424 and also includes various software components for handling data received by RF circuitry 1408 and/or external port 1424. External port 1424 (e.g., Universal Serial Bus (USB), FIRE-WIRE, etc.) is adapted for coupling directly to other devices or indirectly over a network (e.g., the Internet, wireless LAN, etc.). In some embodiments, the external port is a multi-pin (e.g., 30-pin) connector.

Contact/motion module 1430 may detect contact with touch screen 1412 (in conjunction with display controller 1456) and other touch sensitive devices (e.g., a touchpad or physical click wheel). Contact/motion module 1430 includes various software components for performing various operations related to detection of contact, such as determining if contact has occurred (e.g., detecting a finger-down event), determining if there is movement of the contact and tracking the movement across the touch-sensitive surface (e.g., detecting one or more finger-dragging events), and determining if the contact has ceased (e.g., detecting a finger-up event or a break in contact). Contact/motion module 1430 receives contact data from the touch-sensitive surface. Determining movement of the point of contact, which is represented by a series of contact data, may include determining speed (magnitude), velocity (magnitude and direction), and/or an acceleration (a change in magnitude and/or direction) of the point of contact. These operations may be applied to single contacts (e.g., one finger contacts) or to multiple simultaneous contacts (e.g., "multitouch"/multiple finger contacts). In some embodiments, contact/motion module 1430 and display controller 1456 detect contact on a touchpad.

Contact/motion module 1430 may detect a gesture input by a user. Different gestures on the touch-sensitive surface have different contact patterns. Thus, a gesture may be detected by detecting a particular contact pattern. For example, detecting a finger tap gesture includes detecting a finger-down event followed by detecting a finger-up (lift off) event at the same position (or substantially the same position) as the finger-down event (e.g., at the position of an icon). As another example, detecting a finger swipe gesture on the touch-sensitive surface includes detecting a finger-down event followed by detecting one or more finger-dragging events, and subsequently followed by detecting a finger-up (lift off) event.

Graphics module 1432 includes various known software components for rendering and displaying graphics on touch screen 1412 or other display, including components for changing the intensity of graphics that are displayed. As used herein, the term "graphics" includes any object that can be displayed to a user, including without limitation text, web pages, icons (such as user-interface objects including soft keys), digital images, videos, animations and the like.

In some embodiments, graphics module 1432 stores data representing graphics to be used. Each graphic may be assigned a corresponding code. Graphics module 1432 receives, from applications etc., one or more codes specifying graphics to be displayed along with, if necessary, coordinate data and other graphic property data, and then generates screen image data to output to display controller 1456.

Text input module 1434, which may be a component of graphics module 1432, provides soft keyboards for entering text in various applications (e.g., contacts 1437, e-mail 1440, IM 1441, browser 1447, and any other application that needs text input).

GPS module 1435 determines the location of the device and provides this information for use in various applications (e.g., to telephone 1438 for use in location-based dialing, to camera 1443 as picture/video metadata, and to applications that provide location-based services such as weather widgets, local yellow page widgets, and map/navigation widgets).

Applications 1436 may include the following modules (or sets of instructions), or a subset or superset thereof:
contacts module (sometimes called an address book or contact list);
telephone module;
video conferencing module;
e-mail client module;
instant messaging (IM) module;
workout support module;
camera module for still and/or video images;
image management module;
browser module;
calendar module;
widget modules, which may include one or more of: weather widget, stocks widget, calculator widget, alarm clock widget, dictionary widget, and other widgets obtained by the user, as well as user-created widgets;
widget creator module for making user-created widgets;
search module;
video and music player module, which may be made up of a video player module and a music player module;
notes module;
map module; and/or
online video module.

Examples of other applications 1436 that may be stored in memory 1402 include other word processing applications, other image editing applications, drawing applications, presentation applications, JAVA-enabled applications, encryption, digital rights management, voice recognition, and voice replication.

Each of the above identified modules and applications correspond to a set of executable instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise re-arranged in various embodiments. In some embodiments, memory 1402 may store a subset of the modules and data structures identified above. Furthermore, memory 1402 may store additional modules and data structures not described above.

In some embodiments, device 1400 is a device where operation of a predefined set of functions on the device is performed exclusively through a touch screen and/or a touchpad. By using a touch screen and/or a touchpad as the primary input control device for operation of device 1400, the number of physical input control devices (such as push buttons, dials, and the like) on device 1400 may be reduced.

The predefined set of functions that may be performed exclusively through a touch screen and/or a touchpad include navigation between user interfaces. In some embodiments, the touchpad, when touched by the user, navigates device 1400 to a main, home, or root menu from any user interface that may be displayed on device 1400. In such embodiments, the touchpad may be referred to as a "menu button." In some other embodiments, the menu button may be a physical push button or other physical input control device instead of a touchpad.

Figure 15:
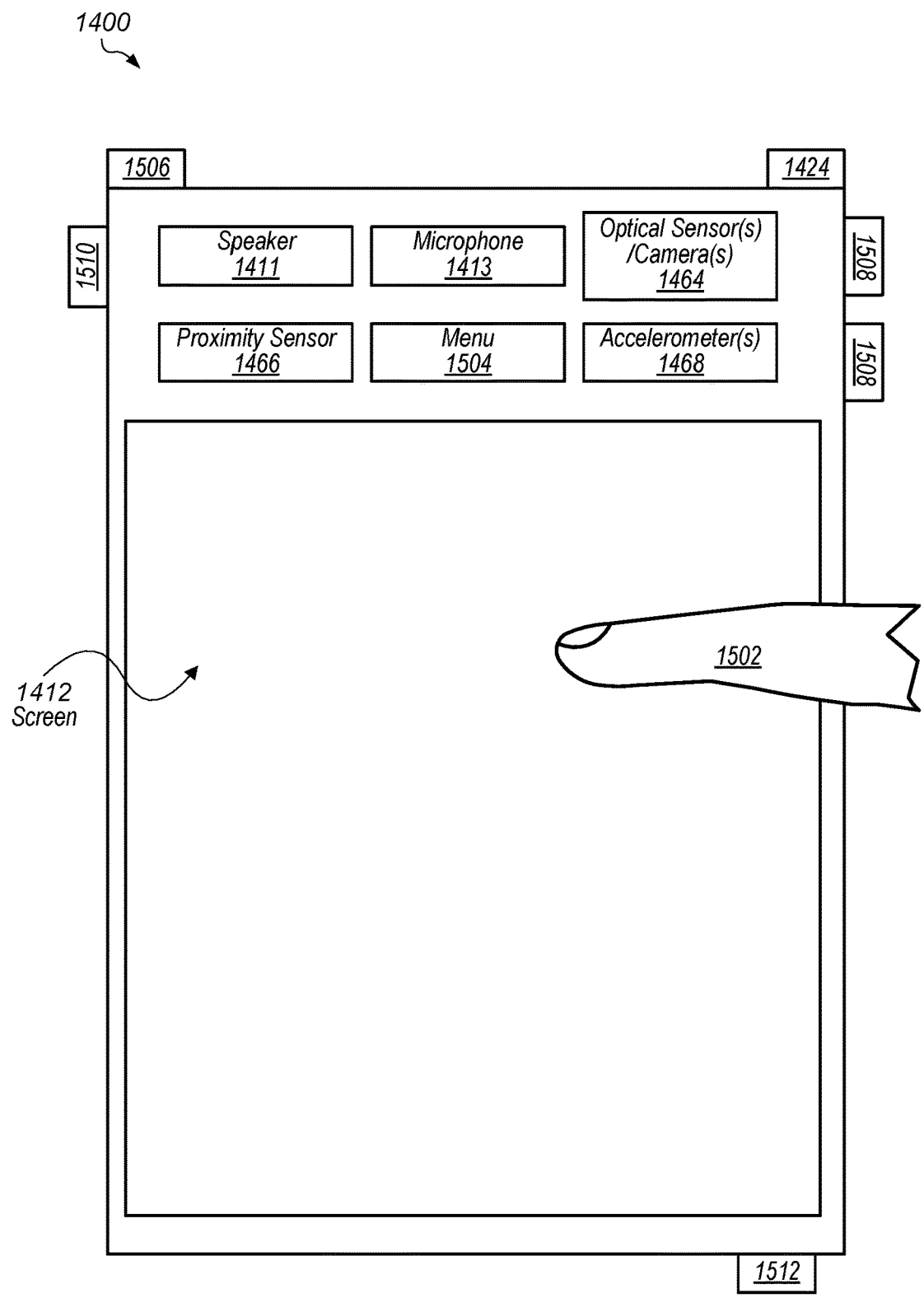
FIG. 15 depicts a portable multifunction device having a camera, in accordance with some embodiments.

FIG. 15 illustrates an example portable multifunction device 1400 that may include a camera module (e.g., the cameras described above with reference to FIGS. 1-5), in accordance with some embodiments. The device 1400 may include a touch screen 1412. The touch screen 1412 may display one or more graphics within user interface (UI) 1500. In this embodiment, as well as others described below, a user may select one or more of the graphics by making a gesture on the graphics, for example, with one or more fingers 1502 (not drawn to scale in the figure) or one or more styluses (not shown).

Device 1400 may also include one or more physical buttons, such as "home" or menu button 1504. As described previously, menu button 1504 may be used to navigate to any application 1436 in a set of applications that may be executed on device 1400. Alternatively, in some embodiments, the menu button 1504 is implemented as a soft key in a GUI displayed on touch screen 1412.

In one embodiment, device 1400 includes touch screen 1412, menu button 1504, push button 1506 for powering the device on/off and locking the device, volume adjustment button(s) 1508, Subscriber Identity Module (SIM) card slot 1510, head set jack 1512, and docking/charging external port 1424. Push button 1506 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 1400 also may accept verbal input for activation or deactivation of some functions through microphone 1413.

It should be noted that, although many of the examples herein are given with reference to optical sensor/camera 1464 (on the front of a device), a rear-facing camera or optical sensor that is pointed opposite from the display may be used instead of or in addition to an optical sensor/camera 1464 on the front of a device.

Example Computer System

Figure 16:
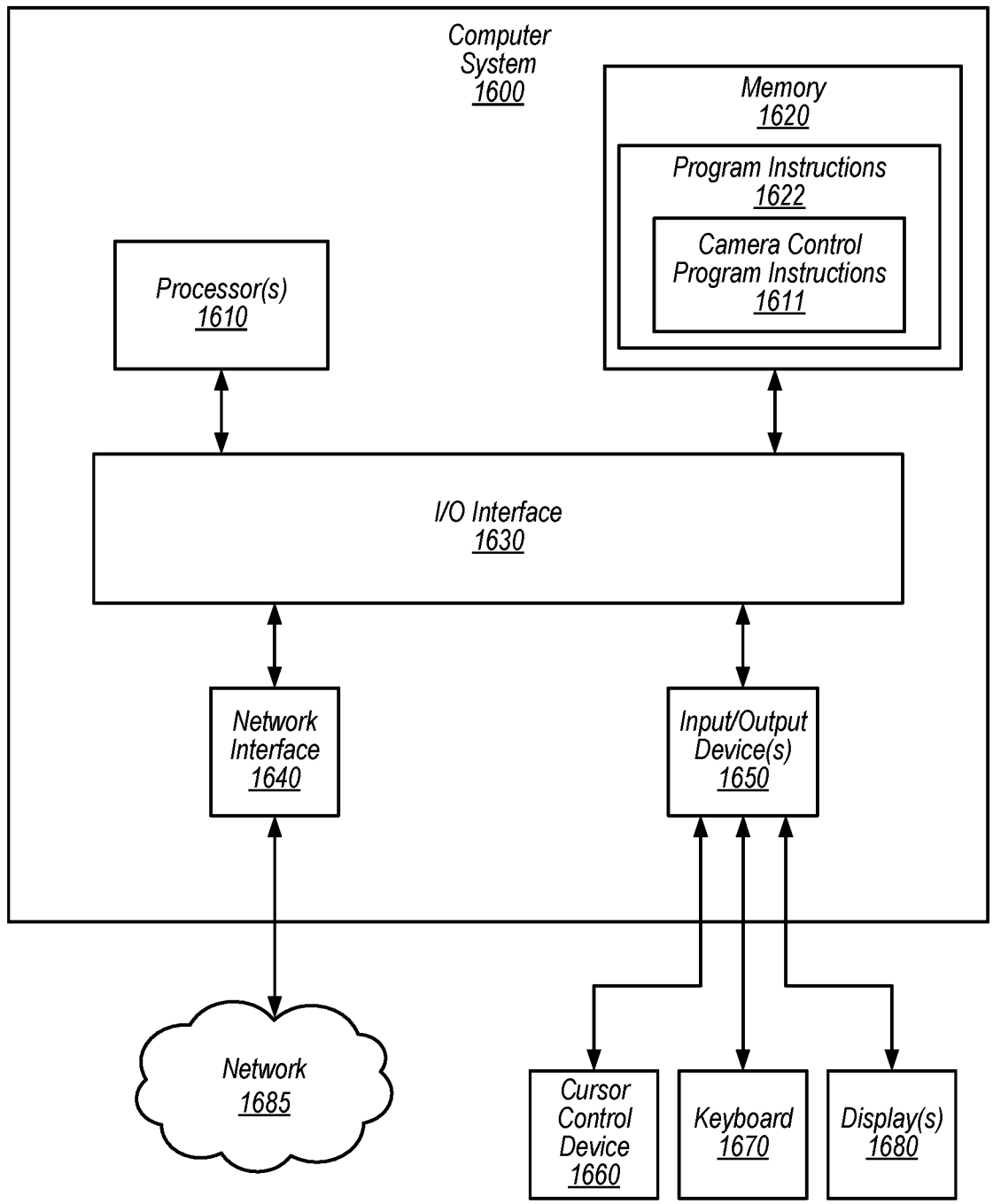
FIG. 16 illustrates an example computer system that may include a camera, in accordance with some embodiments. The example computer system may be configured to implement aspects of the system and method for camera control, in accordance with some embodiments.

FIG. 16 illustrates an example computer system 1600 that may include a camera module (e.g., the cameras described above with reference to FIGS. 1-5), in accordance with some embodiments. The computer system 1600 may be configured to execute any or all of the embodiments described above. In different embodiments, computer system 1600 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various embodiments of a camera motion control system as described herein, including embodiments of magnetic position sensing, as described herein may be executed in one or more computer systems 1600, which may interact with various other devices. Note that any component, action, or functionality described above with respect to FIGS. 1-15 may be implemented on one or more computers configured as computer system 1600 of FIG. 16, according to various embodiments. In the illustrated embodiment, computer system 1600 includes one or more processors 1610 coupled to a system memory 1620 via an input/output (I/O) interface 1630. Computer system 1600 further includes a network interface 1640 coupled to I/O interface 1630, and one or more input/output devices 1650, such as cursor control device 1660, keyboard 1670, and display(s) 1680. In some cases, it is contemplated that embodiments may be implemented using a single instance of computer system 1600, while in other embodiments multiple such systems, or multiple nodes making up computer system 1600, may be configured to host different portions or instances of embodiments. For example, in one embodiment some elements may be implemented via one or more nodes of computer system 1600 that are distinct from those nodes implementing other elements.

In various embodiments, computer system 1600 may be a uniprocessor system including one processor 1610, or a multiprocessor system including several processors 1610 (e.g., two, four, eight, or another suitable number). Processors 1610 may be any suitable processor capable of executing instructions. For example, in various embodiments processors 1610 may be general-purpose or embedded processors implementing any of a variety of instruction set architectures (ISAs), such as the x86, PowerPC, SPARC, or MIPS ISAs, or any other suitable ISA. In multiprocessor systems, each of processors 1610 may commonly, but not necessarily, implement the same ISA.

System memory 1620 may be configured to store camera control program instructions 1622 and/or camera control data accessible by processor 1610. In various embodiments, system memory 1620 may be implemented using any suitable memory technology, such as static random access memory (SRAM), synchronous dynamic RAM (SDRAM), nonvolatile/Flash-type memory, or any other type of memory. In the illustrated embodiment, program instructions 1622 may be configured to implement a lens control application 1624 incorporating any of the functionality described above. Additionally, existing camera control data 1632 of memory 1620 may include any of the information or data structures described above. In some embodiments, program instructions and/or data may be received, sent or stored upon different types of computer-accessible media or on similar media separate from system memory 1620 or computer system 1600. While computer system 1600 is described as implementing the functionality of functional blocks of previous Figures, any of the functionality described herein may be implemented via such a computer system.

In one embodiment, I/O interface 1630 may be configured to coordinate I/O traffic between processor 1610, system memory 1620, and any peripheral devices in the device, including network interface 1640 or other peripheral interfaces, such as input/output devices 1650. In some embodiments, I/O interface 1630 may perform any necessary protocol, timing or other data transformations to convert data signals from one component (e.g., system memory 1620) into a format suitable for use by another component (e.g., processor 1610). In some embodiments, I/O interface 1630 may include support for devices attached through various types of peripheral buses, such as a variant of the Peripheral Component Interconnect (PCI) bus standard or the Universal Serial Bus (USB) standard, for example. In some embodiments, the function of I/O interface 1630 may be split into two or more separate components, such as a north bridge and a south bridge, for example. Also, in some embodiments some or all of the functionality of I/O interface 1630, such as an interface to system memory 1620, may be incorporated directly into processor 1610.

Network interface 1640 may be configured to allow data to be exchanged between computer system 1600 and other devices attached to a network 1685 (e.g., carrier or agent devices) or between nodes of computer system 1600. Network 1685 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 1640 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1650 may, in some embodiments, include one or more display terminals, keyboards, keypads, touchpads, scanning devices, voice or optical recognition devices, or any other devices suitable for entering or accessing data by one or more computer systems 1600. Multiple input/output devices 1650 may be present in computer system 1600 or may be distributed on various nodes of computer system 1600. In some embodiments, similar input/output devices may be separate from computer system 1600 and may interact with one or more nodes of computer system 1600 through a wired or wireless connection, such as over network interface 1640.

As shown in FIG. 16, memory 1620 may include program instructions 1622, which may be processor-executable to implement any element or action described above. In one embodiment, the program instructions may implement the methods described above. In other embodiments, different elements and data may be included. Note that data may include any data or information described above.

Those skilled in the art will appreciate that computer system 1600 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 1600 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1600 may be transmitted to computer system 1600 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

Additional descriptions of embodiments:

CLAUSE 1: A camera, comprising:
  a lens in a lens carrier;
  an image sensor for capturing a digital representation of light transiting the lens;
  an axial motion voice coil motor for focusing light from the lens on the image sensor by moving a lens assembly containing the lens along an optical axis of the lens, wherein
    the axial motion voice coil motor comprises
      a suspension assembly for moveably mounting the lens carrier to an actuator base,
      a plurality of shared magnets mounted to the actuator base, and
      a focusing coil fixedly mounted to the lens carrier and mounted to the actuator base through the suspension assembly; and
  a transverse motion voice coil motor, wherein
    the transverse motion voice coil motor comprises
      an image sensor frame member,
      one or more flexible members for mechanically connecting the image sensor frame member to a frame of the transverse motion voice coil motor, and
      a plurality of transverse motion coils mounted to the image sensor frame member within the magnetic fields of the shared magnets, for producing forces for moving the image sensor frame member in a plurality of directions orthogonal to the optical axis.

CLAUSE 2: The camera of clause 1, wherein
  the flexible members mechanically and electrically connect an image sensor resting in the image sensor carrier to a frame of the transverse motion voice coil motor, and
  the flexible members include electrical signal traces.

CLAUSE 3: The camera of any of clauses 1-2, wherein
  the flexible members comprise metal flexure bodies carrying electrical signal traces electrically isolated from the metal flexure bodies by polymide insulator layers.

CLAUSE 4: The camera of any of clauses 1-3, wherein
  the transverse motion coils are mounted on a flexible printed circuit carrying power to the transverse motion coils for operation of the transverse motion voice coil motor.

CLAUSE 5: The camera of any of clauses 1-4, wherein
  the optical image stabilization coils are corner-mounted on a flexible printed circuit mechanically connected to the actuator base and mechanically isolated from the autofocus voice coil motor.

CLAUSE 6: The camera of any of clauses 1-5, wherein
  a bearing surface end stop is mounted to the base for restricting motion of the optical image stabilization voice coil motor.

CLAUSE 7: The camera of any of clauses 1-6, wherein
  a bearing surface end stop is mounted to the actuator base for restricting motion of the image sensor along the optical axis.

CLAUSE 8: The camera of any of clauses 1-7, wherein the transverse motion voice control motor further includes:
  one or more flexure stabilizer members configured to mechanically connect flexible members of the one or more flexible members to each other such that the one or more flexure stabilizer members prevent interference between the flexible members.

CLAUSE 9: The camera of clause 8, wherein:
the flexible members include a first flexible member and a second flexible member that are parallel to each other; and
the one or more flexure stabilizer members include a flexure stabilizer member that connects the first flexure arm to the second flexure arm and extends along an axis that is orthogonal to the first flexure arm and the second flexure arm.

CLAUSE 10: A camera actuator, comprising:
an actuator base;
an autofocus voice coil motor, wherein
the autofocus voice coil motor comprises
a lens carrier moveably mounted to the actuator base,
a plurality of shared magnets mounted to the base,
an autofocus coil fixedly mounted to the lens for producing forces in a direction of an optical axis of one or more lenses of the lens carrier; and
an optical image stabilization voice coil motor, wherein
the optical image stabilization voice coil motor comprises
an image sensor carrier moveably mounted to the actuator base, and
a plurality of optical image stabilization coils mounted to the image sensor carrier within the magnetic fields of the shared magnets, for producing forces for moving the image sensor carrier in a plurality of directions orthogonal to the optical axis.

CLAUSE 11: The camera actuator of clause 10, wherein the image sensor carrier further comprises one or more flexible members for mechanically connecting an image sensor resting in the image sensor carrier to a frame of the optical image stabilization voice coil motor.

CLAUSE 12: The camera actuator of any of clauses 10-11, wherein
the image sensor carrier further comprises one or more flexible members for mechanically and electrically connecting an image sensor resting in the image sensor carrier to a frame of the optical image stabilization voice coil motor, and
the flexible members include electrical signal traces.

CLAUSE 13: The camera actuator of any of clauses 10-12, wherein
the image sensor carrier further comprises one or more flexible members for mechanically and electrically connecting an image sensor resting in the image sensor carrier to a frame of the optical image stabilization voice coil motor, and
the flexible members comprise metal flexure bodies carrying electrical signal traces electrically isolated from the metal flexure bodies by polymide insulator layers.

CLAUSE 14: The camera actuator of any of clauses 10-13, wherein
the optical image stabilization coils are mounted on a flexible printed circuit carrying power to the coils for operation of the optical image stabilization voice coil motor.

CLAUSE 15: The camera actuator of any of clauses 10-14, wherein
the optical image stabilization coils are corner-mounted on a flexible printed circuit mechanically connected to the actuator base and mechanically isolated from the autofocus voice coil motor.

CLAUSE 16: The camera actuator of any of clauses 10-15, wherein
a bearing surface end stop is mounted to the base for restricting motion of the optical image stabilization voice coil motor.

CLAUSE 17: A mobile multifunction device, comprising:
a camera module, including:
a lens including one or more lens elements that define an optical axis;
an image sensor configured to capture light passing through the lens and convert the captured light into image signals;
a voice coil motor (VCM) actuator, including:
an inner frame coupled to the image sensor and configured to receive the image signals;
an outer frame that surrounds the inner frame along a plane that is orthogonal to the optical axis; and
multiple spring arms configured to mechanically connect the inner frame to the outer frame; and
electrical traces configured to convey the image signals from the inner frame to the outer frame;
a display; and
one or more processors configured to:
cause the VCM actuator to move the first frame relative to the second frame in a plurality of directions orthogonal to the optical axis; and
cause the display to present an image based at least in part on one or more of the image signals that have been conveyed from the inner frame to the outer frame via the electrical traces.

CLAUSE 18: The mobile multifunction device of clause 17, wherein the VCM actuator further includes:
one or more flexure stabilizer members configured to mechanically connect spring arms of the multiple spring arms such that the flexure stabilizer member limits motion of the spring arms along the plane that is orthogonal to the optical axis.

CLAUSE 19: The mobile multifunction device of clause 18, wherein:
the multiple spring arms include:
a first array of spring arms that are parallel to each other; and
a second array of spring arms that are parallel to each other, wherein the second array of spring arms is not parallel to the first array of spring arms; and
the one or more flexure stabilizer members include:
a first set of one or more flexure stabilizer members that connect the first array of spring arms to each other along a first axis that is orthogonal to the optical axis; and
a second set of one or more flexure stabilizer members that connect the second array of spring arms to each other along a second axis that is orthogonal to the optical axis.

CLAUSE 20: The mobile multifunction device of any of clauses 17-19, wherein at least a portion of the electrical traces are routed from the inner frame to the outer frame via one or more spring arms of the multiple spring arms.

CLAUSE 21: A camera, comprising:
a lens including one or more lens elements that define an optical axis;
an image sensor configured to capture light passing through the lens and convert the captured light into image signals; and a voice coil motor (VCM) actuator, including:
   a first frame coupled to the image sensor such that:
      the image sensor moves together with the first frame; and
      the first frame receives the image signals;
   a second frame;
   multiple flexure arms configured to mechanically connect the first frame to the second frame; and
   one or more flexure stabilizer members configured to mechanically connect flexure arms of the multiple flexure arms to each other such that the one or more flexure stabilizer members prevent interference between the flexure arms;
   wherein the VCM actuator is configured to move the first frame such that the image sensor moves relative to the second frame in a plurality of directions orthogonal to the optical axis.

CLAUSE 22: The camera of clause 21, wherein:
   the flexure arms include a first flexure arm and a second flexure arm that are parallel to each other;
   the one or more flexure stabilizer members include a flexure stabilizer member that connects the first flexure arm to the second flexure arm and extends along an axis that is orthogonal to the first flexure arm and the second flexure arm.

CLAUSE 23: The camera of any of clauses 21-22, further comprising:
   a flex circuit, including:
      a first end fixed to the first frame; and
      a second end fixed to the second frame;
   one or more electrical traces configured to convey the image signals from the first frame to the second frame, wherein at least a portion of the one or more electrical traces is routed from the first frame to the second frame via the flex circuit.

CLAUSE 24: The camera of any of clauses 21-23, further comprising:
   one or more electrical traces configured to convey the image signals from the first frame to the second frame, wherein at least a portion of the one or more electrical traces is routed from the first frame to the second frame via one or more flexure arms of the multiple flexure arms.

CLAUSE 25: The camera of clause 24, wherein:
   the flexure arms include a first flexure arm and a second flexure arm;
   the one or more flexure stabilizer members include a flexure stabilizer member that connects the first flexure arm to the second flexure arm; and
   the at least a portion of the one or more electrical traces is further routed from the first flexure arm to the second flexure arm via the flexure stabilizer member.

CLAUSE 26: The camera of any of clauses 21-25, further comprising:
   a flex circuit, including:
      a first end fixed to the first frame; and
      a second end fixed to the second frame;
   electrical traces configured to convey the image signals from the first frame to the second frame, wherein:
      the electrical traces include a first set of one or more electrical traces and a second set of one or more electrical traces;
      at least a portion of the first set of one or more electrical traces is routed from the first frame to the second frame via the flex circuit; and
      at least a portion of the second set of one or more electrical traces is routed from the first frame to the second frame via a flexure arm of the multiple flexure arms.

CLAUSE 27: The camera of any of clauses 21-26, wherein:
   the first frame includes:
      a first portion that extends along a plane that is orthogonal to the optical axis;
      a second portion that extends along the plane; and
      a bend portion that extends along the plane and connects the first portion to the second portion;
   the multiple flexure arms include respective flexure arms that each include:
      a respective first portion that is parallel to the first portion of the first frame;
      a respective second portion that is parallel to the second portion of the first frame; and
      a respective bend portion that connects the respective first portion to the respective second portion.

CLAUSE 28: The camera of clause 27, wherein:
   the one or more flexure stabilizer members include a flexure stabilizer member that connects the respective flexure arms to each other along an axis that is orthogonal to the respective bend portions of the respective flexure arms.

CLAUSE 29: A voice coil motor (VCM) actuator, comprising:
   one or more actuator magnets;
   one or more actuator coils;
   a dynamic platform configured to be coupled to an image sensor of a camera;
   a static platform configured to be static relative to the dynamic platform;
   multiple spring arms configured to mechanically connect the dynamic platform to the static platform, the multiple spring arms including a first spring arm and a second spring arm; and
   one or more flexure stabilizer members, including a flexure stabilizer member configured to mechanically connect the first spring arm to the second spring arm such that the flexure stabilizer member stabilizes relative motion between the first spring arm and the second spring arm along a plane that is orthogonal to the optical axis;
   wherein the one or more actuator magnets and the one or more actuator coils are configured to magnetically interact to move the dynamic platform relative to the static platform in a plurality of directions orthogonal to an optical axis defined by one or more lenses of the camera.

CLAUSE 30: The VCM actuator of clause 29, wherein:
   the dynamic platform is further configured to receive image signals;
   the VCM actuator further includes:
      a flex circuit, including:
         a first end connected to the first frame;
         a second end connected to the second frame; and
         a middle portion between the first end and the second end;
      the flex circuit includes electrical traces configured to convey the image signals from the dynamic platform to the static platform; and
      the middle portion of the flex circuit includes an amount of slack that facilitates relative movement between the first end of the flex circuit and the second end of the flex circuit.

CLAUSE 31: The VCM actuator of any of clauses 29-30, wherein:
the dynamic platform is further configured to receive image signals;
the VCM actuator further includes:
a first flex circuit, including:
a first end connected to a first side of the first frame; and
a second end connected to a first side of the second frame;
a second flex circuit, including:
a first end connected to a second side of the first frame that is different than the first side of the first frame;
a second end connected to a second side of the second frame that is different than the second side of the second frame;
each of the first flex circuit and the second flex circuit includes electrical traces configured to convey the image signals from the dynamic platform to the static platform.

CLAUSE 32: The VCM actuator of any of clauses 29-31, wherein:
the dynamic platform is further configured to receive image signals; and
the first spring arm and the second spring arm each include one or more electrical traces that are configured to convey one or more of the image signals from the dynamic platform to the static platform.

CLAUSE 33: The VCM actuator of clause 32, wherein:
the one or more electrical traces include:
a first electrical trace routed along a first side of the first spring arm; and
a second electrical trace routed along a second side of the first spring arm that is opposite the first side of the first spring arm.

CLAUSE 34: The VCM actuator of any of clauses 29-33, wherein:
the multiple spring arms and the one or more flexure stabilizer members are integrally formed.

CLAUSE 35: A mobile multifunction device, comprising:
a camera module, including:
a lens including one or more lens elements that define an optical axis;
an image sensor configured to capture light passing through the lens and convert the captured light into image signals;
a voice coil motor (VCM) actuator, including:
an inner frame coupled to the image sensor and configured to receive the image signals;
an outer frame that surrounds the inner frame along a plane that is orthogonal to the optical axis;
multiple spring arms configured to mechanically connect the inner frame to the outer frame; and
one or more flexure stabilizer members configured to mechanically connect spring arms of the multiple spring arms such that the flexure stabilizer member limits motion of the spring arms along the plane that is orthogonal to the optical axis; and
electrical traces configured to convey the image signals from the inner frame to the outer frame;
a display; and
one or more processors configured to:
cause the transverse motion VCM actuator to move the first frame relative to the second frame in a plurality of directions orthogonal to the optical axis; and
cause the display to present an image based at least in part on one or more of the image signals that have been conveyed from the inner frame to the outer frame via the electrical traces.

CLAUSE 36: The mobile multifunction device of clause 35, wherein:
the multiple spring arms include:
a first array of spring arms that are parallel to each other; and
a second array of spring arms that are parallel to each other, wherein the second array of spring arms is not parallel to the first array of spring arms; and
the one or more flexure stabilizer members include:
a first set of one or more flexure stabilizer members that connect the first array of spring arms to each other along a first axis that is orthogonal to the optical axis; and
a second set of one or more flexure stabilizer members that connect the second array of spring arms to each other along a second axis that is orthogonal to the optical axis.

CLAUSE 37: The mobile multifunction device of clause 36, wherein:
the inner frame defines a periphery that is orthogonal to the optical axis;
a first portion of the periphery is recessed or extruded relative to a second portion of the periphery that is adjacent to the first portion; and
the first array of spring arms are connected to the inner frame at the first portion of the periphery.

CLAUSE 38: The mobile multifunction device of clause 36, wherein:
the first array of spring arms includes:
multiple straight portions that individually extend along a respective axis that is orthogonal to the optical axis, the multiple straight portions including a first straight portion and a second straight portion; and
multiple bend portions, including a first bend portion that connects the first straight portion to the second straight portion along the plane that is orthogonal to the optical axis; and
the first set of one or more flexure stabilizer members include:
a first flexure stabilizer member configured to connect the first array of spring arms to each other at connections within the first straight portion; and
a second flexure stabilizer member configured to connect the first array of spring arms to each other at connections within the second straight portion.

CLAUSE 39: The mobile multifunction device of any of clauses 35-38, wherein:
the multiple spring arms and the one or more flexure stabilizer members form a pattern that is symmetric along at least two axes that are orthogonal to the optical axis.

CLAUSE 40: The mobile multifunction device of any of clauses 35-38, wherein:
the multiple spring arms and the one or more flexure stabilizer members form a pattern that is asymmetric along at least one axis orthogonal to the optical axis.

Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A voice coil motor (VCM) actuator, comprising:
a dynamic platform configured to couple with an image sensor of a camera such that the image sensor moves together with the dynamic platform;
a static platform;
multiple flexure arms that mechanically connect the dynamic platform to the static platform; and
one or more electrical traces to convey the image signals from the dynamic platform to the static platform, wherein at least a portion of the one or more electrical traces is routed from the dynamic platform to the static platform via one or more flexure arms of the multiple flexure arms;
wherein the VCM actuator is configured to move the dynamic platform such that the image sensor moves relative to the static platform in a plurality of directions orthogonal to an optical axis of the camera.

2. The VCM actuator of claim 1, wherein:
the one or more flexure arms comprise a first flexure arm and a second flexure arm; and
the one or more electrical traces comprise:
a first electrical trace routed along a first side of the first flexure arm; and
a second electrical trace routed along a second side of the second flexure arm, the second side facing opposite the first side of the first flexure arm.

3. The VCM actuator of claim 1, wherein:
the one or more flexure arms comprise metal flexure bodies that carry the at least a portion of the one or more electrical traces; and
the at least a portion of the one or more electrical traces are electrically isolated from the metal flexure bodies via one or more insulator layers.

4. The VCM actuator of claim 3, wherein the one or more insulator layers comprise one or more polyimide layers.

5. The VCM actuator of claim 1, wherein the one or more flexure arms include a first flexure arm and a second flexure arm that are parallel to each other.

6. The VCM actuator of claim 1, wherein:
the one or more flexure arms comprise a first flexure arm and a second flexure arm;
the VCM actuator further comprises:
one or more flexure stabilizer members that mechanically connect flexure arms of the multiple flexure arms to each other such that the one or more flexure stabilizer members prevent interference between the flexure arms, the one or more flexure stabilizer members comprising a flexure stabilizer member that connects the first flexure arm to the second flexure arm; and
the at least a portion of the one or more electrical traces is further routed from the first flexure arm to the second flexure arm via the flexure stabilizer member.

7. The VCM actuator of claim 6, wherein the flexure stabilizer member, that connects the first flexure arm to the second flexure arm, extends along an axis that is orthogonal to the first flexure arm and the second flexure arm.

8. The VCM actuator of claim 1, wherein:
the dynamic platform includes:
a first portion that extends along a plane that is orthogonal to the optical axis;
a second portion that extends along the plane; and
a bend portion that extends along the plane and connects the first portion to the second portion; and
the multiple flexure arms include respective flexure arms that each include:
a respective first portion that is parallel to the first portion of the first frame;
a respective second portion that is parallel to the second portion of the first frame; and
a respective bend portion that connects the respective first portion to the respective second portion.

9. A camera, comprising:
a lens in a lens carrier, wherein the lens includes one or more lens elements that define an optical axis;
an image sensor to capture light passing through the lens and convert the captured light into image signals; and
a voice coil motor (VCM) actuator, comprising:
a dynamic platform configured to couple with the image sensor such that the image sensor moves together with the dynamic platform;
a static platform;
multiple flexure arms that mechanically connect the dynamic platform to the static platform; and
one or more electrical traces to convey the image signals from the dynamic platform to the static platform, wherein at least a portion of the one or more electrical traces is routed from the dynamic platform to the static platform via one or more flexure arms of the multiple flexure arms;
wherein the VCM actuator is configured to move the dynamic platform such that the image sensor moves relative to the static platform in a plurality of directions orthogonal to an optical axis of the camera.

10. The camera of claim 9, wherein:
the one or more flexure arms comprise a first flexure arm and a second flexure arm; and
the one or more electrical traces comprise:
a first electrical trace routed along a first side of the first flexure arm; and
a second electrical trace routed along a second side of the second flexure arm, the second side facing opposite the first side of the first flexure arm.

11. The camera of claim 9, wherein:
the one or more flexure arms comprise metal flexure bodies that carry the at least a portion of the one or more electrical traces; and
the at least a portion of the one or more electrical traces are electrically isolated from the metal flexure bodies via one or more insulator layers.

12. The camera of claim 9, further comprising:
a flex circuit, comprising:
a first end fixed to the dynamic platform; and
a second end fixed to the static platform;
wherein:
the at least a portion of the one or more electrical traces that is routed from the dynamic platform to the static platform via the one or more flexure arms comprises at least a portion of a first set of the one or more electrical traces; and
at least a portion of a second set of the one or more electrical traces is routed from the dynamic platform to the static platform via the flex circuit.

13. The camera of claim 9, wherein:
the VCM actuator is an optical image stabilization (OIS) VCM actuator; and
the OIS VCM actuator further comprises a plurality of OIS coils mounted to the dynamic platform within magnetic fields of a plurality of shared magnets mounted to an actuator base, for producing forces for moving the dynamic platform in the plurality of directions orthogonal to the optical axis.

14. The camera of claim 13, wherein OIS coils of the plurality of OIS coils are mounted on the flex circuit.

15. The camera of any of claim 13, further comprising:
an autofocus (AF) VCM actuator, comprising:
the lens carrier, moveably mounted to the actuator base; and
an AF coil fixedly mounted to the lens carrier within magnetic fields of the shared magnets, for producing forces for moving the lens carrier in a direction of the optical axis.

16. A multifunction device, comprising:
a camera, comprising:
a lens in a lens carrier, wherein the lens includes one or more lens elements that define an optical axis;
an image sensor to capture light passing through the lens and convert the captured light into image signals; and
a voice coil motor (VCM) actuator, comprising:
a dynamic platform configured to couple with the image sensor such that the image sensor moves together with the dynamic platform;
a static platform;
multiple flexure arms that mechanically connect the dynamic platform to the static platform; and
one or more electrical traces to convey the image signals from the dynamic platform to the static platform, wherein at least a portion of the one or more electrical traces is routed from the dynamic platform to the static platform via one or more flexure arms of the multiple flexure arms;
wherein the VCM actuator is configured to move the dynamic platform such that the image sensor moves relative to the static platform in a plurality of directions orthogonal to an optical axis of the camera;
one or more processors; and
memory storing program instructions that are executable by the one or more processors to control operation of the camera and to perform one or more other functions of the multifunction device.

17. The multifunction device of claim 16, wherein:
the one or more flexure arms comprise a first flexure arm and a second flexure arm; and
the one or more electrical traces comprise:
a first electrical trace routed along a first side of the first flexure arm; and
a second electrical trace routed along a second side of the second flexure arm, the second side facing opposite the first side of the first flexure arm.

18. The multifunction device of claim 16, wherein:
the one or more flexure arms comprise metal flexure bodies that carry the at least a portion of the one or more electrical traces; and
the at least a portion of the one or more electrical traces are electrically isolated from the metal flexure bodies via one or more insulator layers.

19. The multifunction device of claim 18, wherein the one or more insulator layers comprise one or more polyimide layers.

20. The multifunction device of claim 16, further comprising:
a display;
wherein the program instructions are executable by the one or more processors to:
cause the OIS VCM actuator to move the dynamic platform relative to the static platform in the plurality of directions orthogonal to the optical axis; and
cause the display to present an image based at least in part on one or more of the image signals conveyed from the dynamic platform to the static platform via the electrical traces.

\* \* \* \* \*